(12) United States Patent
Yamaguchi

(10) Patent No.: US 7,469,132 B2
(45) Date of Patent: Dec. 23, 2008

(54) TRANSMISSION SIGNAL GENERATING APPARATUS

(75) Inventor: Satoshi Yamaguchi, Sagamihara (JP)

(73) Assignee: Panasonic Corporation, Osaka (JP)

( * ) Notice: Subject to any disclaimer, the term of this patent is extended or adjusted under 35 U.S.C. 154(b) by 499 days.

(21) Appl. No.: 11/269,710

(22) Filed: Nov. 9, 2005

(65) Prior Publication Data

US 2006/0099918 A1    May 11, 2006

(30) Foreign Application Priority Data

Nov. 10, 2004    (JP) ............... 2004-326318

(51) Int. Cl.
*H04B 1/18* (2006.01)
*H04B 1/16* (2006.01)

(52) U.S. Cl. ............... 455/177.1; 455/180.3; 455/200.1

(58) Field of Classification Search ............... 455/177.1, 455/200.1, 355, 115.1, 116, 123, 180.3; 381/104, 381/106, 107, 108

See application file for complete search history.

(56) References Cited

U.S. PATENT DOCUMENTS

| | | | | |
|---|---|---|---|---|
| 3,789,143 A | * | 1/1974 | Blackmer | 381/106 |
| 4,101,840 A | * | 7/1978 | Fricke et al. | 330/127 |
| 4,123,711 A | * | 10/1978 | Chow | 455/72 |
| 4,501,019 A | * | 2/1985 | Matsukura et al. | 455/112 |
| 4,528,522 A | * | 7/1985 | Matsuura | 331/2 |
| 4,562,591 A | * | 12/1985 | Stikvoort | 381/106 |
| 4,864,246 A | * | 9/1989 | Kato et al. | 330/129 |
| 5,631,601 A | * | 5/1997 | Horsfall et al. | 329/325 |
| 6,806,781 B2 | * | 10/2004 | Bisanti et al. | 331/36 R |
| 6,826,246 B1 | * | 11/2004 | Brown et al. | 375/376 |

FOREIGN PATENT DOCUMENTS

JP    05122098    5/1993

* cited by examiner

Primary Examiner—Sonny Trinh
(74) Attorney, Agent, or Firm—Dickinson Wright, PLLC

(57) ABSTRACT

In a transmission signal generating apparatus according to the present invention, a voice signal is amplified by a variable amplifier which varies its amplification factor in accordance with an amplitude control signal, and the amplitude of the voice signal output from the variable amplifier is limited by a variable limiter which varies its amplitude limiting range in accordance with the amplitude control signal. The thus amplified and amplitude-limited voice signal is supplied as a modulating signal to a voltage controlled oscillator constituting part of a PLL circuit which generates a transmission signal. A control signal generating section generates the amplitude control signal for the variable amplifier and the variable limiter by detecting the f/v sensitivity of the voltage controlled oscillator based on an output of a low pass filter constituting part of the PLL circuit.

11 Claims, 24 Drawing Sheets

Fig. 10

| INPUT CONDITION | OUTPUTS OF VOLTAGE DETECTION CIRCUIT | |
|---|---|---|
| | D1 | D2 |
| $Vt < VR1$ | L | L |
| $VR1 \leq Vt < VR2$ | H | L |
| $VR2 \leq Vt$ | H | H |

Fig. 14

| INPUT CONDITION | OUTPUTS OF VOLTAGE DETECTION CIRCUIT | | INPUTS TO VARIABLE AMPLIFIER (OUTPUTS OF DATA LATCH) | | VARIABLE AMPLIFIER GAIN |
|---|---|---|---|---|---|
| | D1 | D2 | Q1 | Q2 | |
| $Vt<VR1$ | L | L | L | L | $(1/(1/R2+1/R3+1/R4))/R1$ |
| $VR1 \leqq Vt < VR2$ | H | L | H | L | $(1/(1/R2+1/R4))/R1$ |
| $VR2 \leqq Vt$ | H | H | H | H | $R2/R1$ |

Fig. 17

| INPUT CONDITION | OUTPUTS OF VOLTAGE DETECTION CIRCUIT | | INPUTS TO VARIABLE LIMITER (OUTPUTS OF DATA LATCH) | | VARIABLE LIMITER |
|---|---|---|---|---|---|
| | D1 | D2 | Q1 | Q2 | |
| Vt<VR1 | L | L | L | L | AMPLITUDE WIDTH 1 |
| VR1≦Vt<VR2 | H | L | H | L | AMPLITUDE WIDTH 2 |
| VR2≦Vt | H | H | H | H | AMPLITUDE WIDTH 3 |

Fig. 23

| INPUT CONDITION | OUTPUTS OF VOLTAGE DETECTION CIRCUIT | | INPUTS TO VARIABLE AMPLIFIER INPUTS TO VARIABLE LIMITER (OUTPUTS OF DATA LATCH) | | VARIABLE AMPLIFIER GAIN | VARIABLE LIMITER |
|---|---|---|---|---|---|---|
| | D1 | D2 | Q1 | Q2 | | |
| Vt<VR1 | L | L | L | L | (1/(1/R2+1/R3+1/R4))/R1 | AMPLITUDE WIDTH 1 |
| VR1≦Vt<VR2 | H | L | H | L | (1/(1/R2+1/R4))/R1 | AMPLITUDE WIDTH 2 |
| VR2≦Vt | H | H | H | H | R2/R1 | AMPLITUDE WIDTH 3 |

TRANSMISSION SIGNAL GENERATING APPARATUS

BACKGROUND OF THE INVENTION

1. Field of the Invention

The present invention relates to a transmission signal generating apparatus that performs frequency modulation using a voltage controlled oscillator. More particularly, the invention relates to a transmission signal generating apparatus that automatically adjusts the frequency deviation in frequency modulation by detecting the frequency/voltage sensitivity (hereinafter referred to as the f/v sensitivity) of a voltage controlled oscillator constituting part of a phase locked loop (hereinafter abbreviated PLL). The f/v sensitivity here refers to the rate of change of the frequency with respect to the change in frequency control voltage in the voltage controlled oscillator.

2. Description of the Related Art

In the prior art, transmission signal generating apparatuses that perform frequency modulation have employed schemes that generate frequency modulated signals without automatically adjusting the frequency deviation occurring at the time of the modulation.

A prior art transmission signal generating apparatus that performs frequency modulation will be described with reference to FIG. 6. FIG. 6 shows in simplified form of the prior known transmission signal generating apparatus disclosed in Non-Patent Document 1. In FIG. 6, reference numeral 1 indicates a voice signal, reference numeral 3 a limiter, reference numeral 4 a voltage controlled oscillator (VCO), reference numeral 5 a frequency divider, reference numeral 6 a reference signal, reference numeral 7 a phase comparator (PD), reference numeral 8 a low pass filter (LPF), reference numeral 13 an amplifier, reference numeral 19 a pre-emphasis circuit, and reference numeral 20 a splatter filter.

In this transmission signal generating apparatus, the phase comparator 7 compares the phases of the reference signal 6 and the output signal of the frequency divider 5 which divides the output frequency of the voltage controlled oscillator 4, and an output proportional to the phase difference between the two signals is supplied to the low pass filter 8. The low pass filter 8 is constructed to integrate the output of the phase comparator 7, remove unwanted high frequency components from the output of the phase comparator 7, and output the frequency control voltage to the voltage controlled oscillator 4. The known PLL is implemented with this configuration. The output of the voltage controlled oscillator 4 is sent to a transmitter.

The voice signal 1 is first amplified by the amplifier 13, and then its higher frequencies are emphasized by the pre-emphasis circuit 19 having the frequency characteristic shown in FIG. 7; the resulting signal is passed through the limiter 3 for amplitude limiting. Further, the signal is passed through the splatter filter 20 having the frequency characteristic shown in FIG. 8, where unwanted high frequencies contained in the voice signal are limited, and the resulting signal is output as a modulating signal to the voltage controlled oscillator 4. Then, frequency modulation is performed in the voltage controlled oscillator 4. The frequency modulated output of the voltage controlled oscillator 4, i.e., the frequency modulated signal, is sent as a transmission signal to the transmitter (not shown).

As a prior art technique, Patent Document 1 discloses, for use in an FM transmitter that transmits a data signal by superimposing it on the main signal, a method which detects the frequency distribution of the baseband signal with the data signal and the main signal superimposed thereon, generates a control signal based on the result of the detection of the frequency distribution, and adjusts the amplitude limiting range of a variable limiter by using the control signal.

Patent Document 1: Japanese Unexamined Patent Publication No. H05-122098 (page 3, FIG. 1)

Non-Patent Document 1: Transistor Technology SPECIAL No. 47, Third Edition, 1997, p. 63

In the above prior art technique, the voice signal is amplified by the amplifier 13 so that the modulated transmission signal will have a prescribed frequency deviation, and the amplitude of the voice signal as the modulating signal is limited by the limiter 3 so that it can be accommodated within a given frequency band. However, if the f/v sensitivity of the voltage controlled oscillator 4 varies due to variations in temperature or variations in the characteristics of the constituent elements of the voltage controlled oscillator 4, the frequency deviation at the time of modulation also varies.

FIG. 21 shows the frequency deviation at the time of modulation when the f/v sensitivity of the voltage controlled oscillator is shifted due to such variations. FIG. 21 illustrates an f/v sensitivity reference characteristic A which shows the best condition in which the modulation is set to the maximum value of the maximum frequency deviation, a characteristic B which shows a lower f/v sensitivity than the f/v sensitivity reference characteristic A, and a characteristic C which shows a higher f/v sensitivity than the f/v sensitivity reference characteristic A.

When the f/v sensitivity reference characteristic A shown in FIG. 21 is set as the reference for the f/v sensitivity of the voltage controlled oscillator, then if the f/v sensitivity is shifted toward the lower side as shown by the characteristic B in FIG. 21, the signal level of the transmission signal drops. Accordingly, the S/N ratio of the transmission signal drops, resulting in a degradation of transmission quality.

Conversely, if the f/v sensitivity is shifted toward the higher side as shown by the characteristic C in FIG. 21, the frequency deviation at the time of modulation increases, and the frequency of the transmission signal exceeds the maximum allowable frequency deviation and becomes unable to be accommodated within the given frequency band.

SUMMARY OF THE INVENTION

It is an object of the present invention to provide a transmission signal generating apparatus that can, despite variations in the f/v sensitivity of the voltage controlled oscillator, transmit a voice signal with high transmission quality by making maximum use of the transmission frequency band.

It is another object of the present invention to provide a transmission signal generating apparatus that can accommodate the frequency deviation at the time of modulation within the given transmission frequency band, despite variations in the f/v sensitivity of the voltage controlled oscillator.

A transmission signal generating apparatus according to the present invention comprises:

a phase locked loop containing a voltage controlled oscillator which has an input section for a voice signal and an input section for a frequency control voltage and whose oscillation frequency is controlled by the frequency control voltage, wherein the voice signal is input as a modulating signal to the voltage controlled oscillator and a transmission signal created by frequency modulation of the voice signal is output from the voltage controlled oscillator;

amplitude control means, provided in the voice signal input section of the voltage controlled oscillator and having an input section for an amplitude control signal, for controlling the amplitude of the voice signal in accordance with the amplitude control signal; and a control signal generating section which generates the amplitude control signal by detecting the frequency/voltage sensitivity of the voltage controlled oscillator based on the frequency control voltage.

According to this configuration, when the f/v sensitivity of the voltage controlled oscillator varies, the amplitude control means under control of the control signal generating section adjusts the amplitude of the voice signal so that the voice signal can be transmitted with high transmission quality by making maximum use of the transmission frequency band, and so that the frequency deviation at the time of modulation can be accommodated within the given transmission frequency band.

The amplitude control means is constructed, for example, from a variable amplifier which amplifies the voice signal with an amplification factor varied in accordance with the amplitude control signal.

According to this configuration, the control signal generating section functions to generate the amplitude control signal that causes the amplification factor of the variable amplifier to increase when the f/v sensitivity of the voltage controlled oscillator is shifted to the lower side and to decrease when the f/v sensitivity of the voltage controlled oscillator is shifted to the higher side; in this way, the voice signal can be transmitted with high transmission quality by making maximum use of the transmission frequency band. Further, the frequency deviation at the time of modulation can also be accommodated within the given transmission frequency band.

Here, the control signal generating section comprises, for example, a voltage detection circuit which compares the frequency control voltage with a predetermined threshold value and thereby detects the magnitude of the frequency control voltage applied to the voltage controlled oscillator, and a data latch circuit which holds a voltage detection result fed from the voltage detection circuit and outputs the result as the amplitude control signal to the variable amplifier.

The variable amplifier comprises an operational amplifier, an input resistor provided in an input section of the operational amplifier, and a feedback circuit provided between the input section and an output section of the operational amplifier. The feedback circuit comprises a first feedback resistor connected between the input section and the output section of the operational amplifier, and at least one feedback resistive circuit provided with a switch and connected between the input section and the output section of the operational amplifier. The feedback resistive circuit provided with a switch is a series circuit constructed by connecting the switch in series to a second feedback resistor. The switch is controlled on and off in accordance with the amplitude control signal output from the control signal generating section.

The amplitude control means may be constructed, for example, from a variable limiter which limits the amplitude of the voice signal within an amplitude limiting range varied in accordance with the amplitude control signal.

According to this configuration, the control signal generating section functions to generate the amplitude control signal that causes the amplitude limiting range of the variable limiter to become wider when the f/v sensitivity of the voltage controlled oscillator is shifted to the lower side and to become narrower when the f/v sensitivity of the voltage controlled oscillator is shifted to the higher side; in this way, the frequency deviation at the time of modulation can be accommodated within the given transmission frequency band. Further, the voice signal can also be transmitted with high transmission quality by making maximum use of the transmission frequency band.

Here, the control signal generating section comprises a voltage detection circuit which compares the frequency control voltage with a predetermined threshold value and thereby detects the magnitude of the frequency control voltage applied to the voltage controlled oscillator, and a data latch circuit which holds a voltage detection result fed from the voltage detection circuit and outputs the result as the amplitude control signal to the variable limiter.

The variable limiter comprises: a resistor from one end of which the voice signal is input; an upper limit voltage limiting circuit which is connected to the other end of the resistor and which limits an upper limit value of the amplitude of the voice signal in accordance with an upper limit limiting voltage; a lower limit voltage limiting circuit which is connected to the other end of the resistor and which limits a lower limit value of the amplitude of the voice signal in accordance with a lower limit limiting voltage; a buffer amplifier whose input terminal is connected to that other end of the resistor; an upper limit limiting voltage source which supplies the upper limit limiting voltage to the upper limit voltage limiting circuit, the upper limit limiting voltage being increased or decreased under control of the amplitude control signal output from the control signal generating section; and a lower limit limiting voltage source which supplies the lower limit limiting voltage to the lower limit voltage limiting circuit, the lower limit limiting voltage being increased or decreased under control of the amplitude control signal output from the control signal generating section.

Here, the amplitude control means may comprise a variable amplifier which amplifies the voice signal with an amplification factor varied in accordance with the amplitude control signal, and a variable limiter which limits the amplitude of the voice signal output from the variable amplifier within an amplitude limiting range varied in accordance with the amplitude control signal.

According to this configuration, the control signal generating section functions to generate the amplitude control signal that causes the amplification factor of the variable amplifier to increase and the amplitude limiting range of the variable limiter to become wider when the f/v sensitivity of the voltage controlled oscillator is shifted to the lower side and that causes the amplification factor of the variable amplifier to decrease and the amplitude limiting range of the variable limiter to become narrower when the f/v sensitivity of the voltage controlled oscillator is shifted to the higher side; in this way, the voice signal can be transmitted with high transmission quality by making maximum use of the transmission frequency band, and at the same time, the frequency deviation at the time of modulation can be accommodated within the given frequency band.

Here, the control signal generating section comprises a voltage detection circuit which compares the frequency control voltage with a predetermined threshold value and thereby detects the magnitude of the frequency control voltage applied to the voltage controlled oscillator, and a data latch circuit which holds a voltage detection result fed from the voltage detection circuit and outputs the result as the amplitude control signal to the variable amplifier and the variable limiter.

In one preferred mode of the transmission signal generating apparatus equipped with the variable amplifier and the variable limiter, a microphone for converting the voice signal into an electrical signal is provided in an input section of the variable amplifier; a pre-emphasis circuit for emphasizing high frequencies of the voice signal output from the variable amplifier is provided between the variable amplifier and the variable limiter; a splatter filter for limiting unwanted high frequencies contained in the voice signal output from the variable limiter is provided between the variable limiter and the voltage controlled oscillator; and a transmitter for amplifying and band-limiting an output of the voltage controlled oscillator and an antenna for radiating an output of the transmitter as a transmission wave into space are provided in an output section of the voltage controlled oscillator.

Here, the control signal generating section may comprise a voltage detection circuit which compares the frequency control voltage with a predetermined threshold value and thereby detects the magnitude of the frequency control voltage applied to the voltage controlled oscillator, a CPU which outputs prescribed serial data responsive to a voltage detection result fed from the voltage detection circuit, and a serial decoder which, based on the serial data output from the CPU, generates the amplitude control signal to be supplied to the variable amplifier and the variable limiter.

A frequency deviation adjusting method according to the present invention is a method for adjusting a frequency deviation in frequency modulation in a transmission signal generating apparatus, and comprises a first step for detecting a variation in the frequency/voltage sensitivity of the voltage controlled oscillator, and a second step for adjusting the amplitude of the voice signal based on a detection result from the first step.

According to this method, when the f/v sensitivity varies, the amplitude of the voice signal is adjusted so that the voice signal can be transmitted with high transmission quality by making maximum use of the transmission frequency band, and so that the frequency deviation at the time of modulation can be accommodated within the given frequency band.

Here, the amplitude of the voice signal is adjusted, for example, by adjusting the amplification factor for the voice signal.

According to this method, when the f/v sensitivity is shifted to the lower side, the amplification factor for the voice signal is increased and, when the f/v sensitivity is shifted to the higher side, the amplification factor for the voice signal is reduced, thereby enabling the voice signal to be transmitted with high transmission quality by making maximum use of the transmission frequency band. Further, the frequency deviation at the time of modulation can also be accommodated within the given transmission frequency band.

Alternatively, the amplitude of the signal is adjusted by adjusting the amplitude limiting range for the voice signal.

According to this method, when the f/v sensitivity is shifted to the lower side, the amplitude limiting range for the voice signal is increased and, when the f/v sensitivity is shifted to the higher side, the amplitude limiting range for the voice signal is reduced, thereby enabling the frequency deviation at the time of modulation to be accommodated within the given frequency band. Further, the voice signal can also be transmitted with high transmission quality by making maximum use of the transmission frequency band.

Alternatively, the amplitude of the signal is adjusted by adjusting the amplification factor and the amplitude limiting range for the voice signal.

According to this method, when the f/v sensitivity is shifted to the lower side, the amplification factor for the voice signal is increased while also increasing the amplitude limiting range and, when the f/v sensitivity is shifted to the higher side, the amplification factor for the voice signal is reduced while also reducing the amplitude limiting range; in this way, the voice signal can be transmitted with high transmission quality by making maximum use of the transmission frequency band, and at the same time, the frequency deviation at the time of modulation can be accommodated within the given frequency band.

As described above, according to the transmission signal generating apparatus of the present invention having the above configuration, even when the f/v sensitivity of the voltage controlled oscillator varies, the voice signal can be transmitted with high transmission quality by making maximum use of the transmission frequency band, and the frequency deviation at the time of modulation can be accommodated within the given transmission frequency band; to accomplish this, the control signal generating section detects the f/v sensitivity of the voltage controlled oscillator and controls at least one or the other of the amplification factor of the variable amplifier and the amplitude limiting range of the variable limiter accordingly.

Further, according to the frequency deviation adjusting method of the present invention, when the f/v sensitivity varies, since the amplitude of the voice signal is controlled accordingly, the voice signal can be transmitted with high transmission quality by making maximum use of the transmission frequency band, and the frequency deviation at the time of modulation can be accommodated within the given frequency band.

BRIEF DESCRIPTION OF THE DRAWINGS

FIG. 10 is a table describing the operation of the voltage detection circuit according to the first embodiment of the present invention.

FIG. 14 is a table showing how the amplification factor of the variable amplifier changes according to the first embodiment of the present invention.

FIG. 17 is a table showing how the amplitude limiting range of the variable limiter changes according to the second embodiment of the present invention.

FIG. 23 is a table showing the correspondences between the operations of the individual circuit blocks in the automatic adjusting section according to the third embodiment of the present invention.

DESCRIPTION OF THE PREFERRED EMBODIMENTS

Embodiment 1

Figure 1:
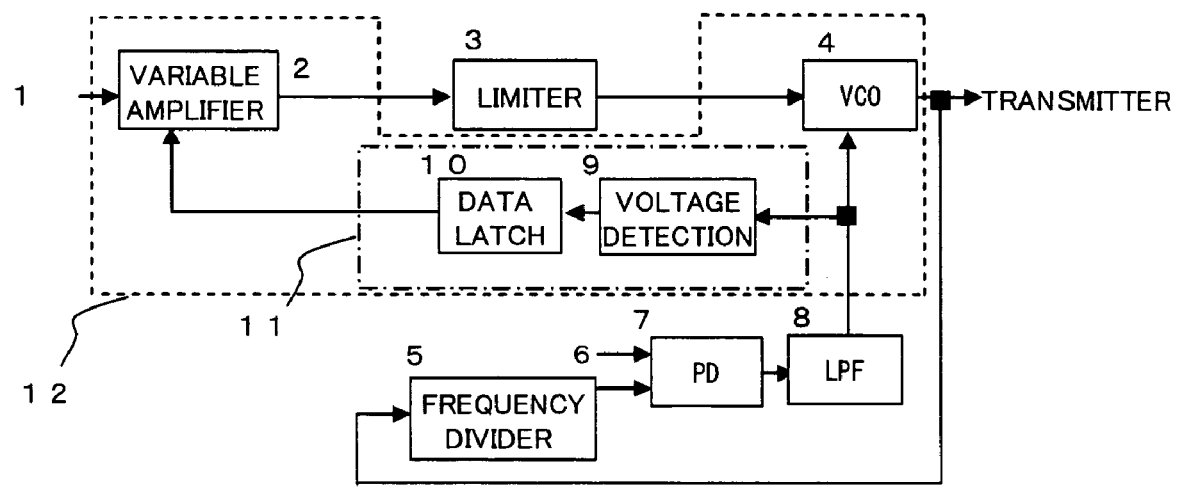
FIG. 1 is a block diagram of a transmission signal generating apparatus according to a first embodiment of the present invention.

FIG. 1 is a block diagram showing a transmission signal generating apparatus according to a first embodiment of the present invention. In FIG. 1, the same constituent elements as those in FIG. 6 are designated by the same reference numerals, and the description thereof will not be repeated here.

In FIG. 1, reference numeral 2 indicates a variable amplifier, reference numeral 11 a variable amplifier control signal generating section, and reference numeral 12 a variable amplifier automatic adjusting section.

Figure 6:
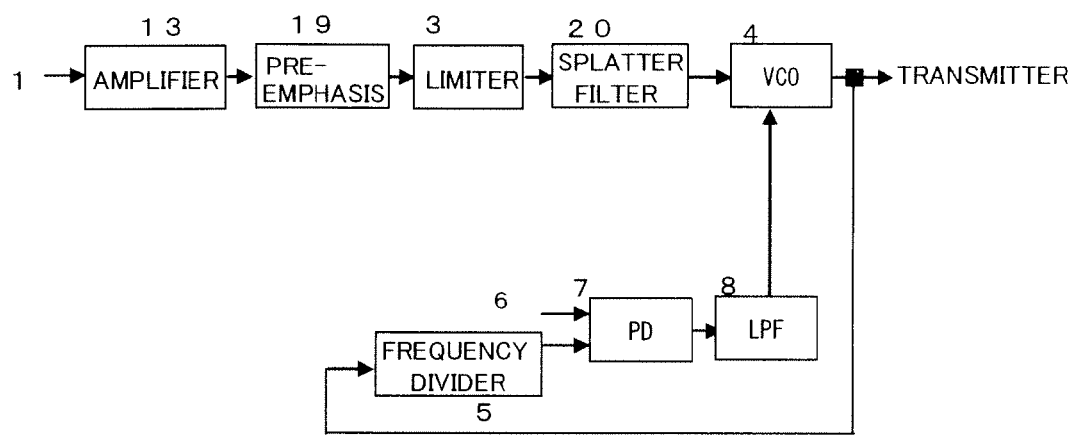
FIG. 6 is a block diagram of a transmission signal generating apparatus according to the prior art.

The known PLL comprising the phase comparator 7, reference signal 6, voltage controlled oscillator 4, frequency divider 5, and low pass filter 8 is the same as that shown in FIG. 6, and therefore, will not be described here.

The variable amplifier automatic adjusting section 12 comprises the variable amplifier 2 which amplifies the voice signal, the variable amplifier control signal generating section 11 which receives the output of the low pass filter 8 that constitutes part of the PLL, and the voltage controlled oscillator 4. The variable amplifier control signal generating section 11 generates an amplitude control signal by detecting the f/v sensitivity of the voltage controlled oscillator 4. The variable amplifier 2 varies its amplification factor in accordance with the amplitude control signal supplied from the variable amplifier control signal generating section 11. The limiter 3 limits the amplitude of the voice signal output from the variable amplifier 2, and outputs the voice signal as a modulating signal to the voltage controlled oscillator 4 that constitutes part of the PLL.

Here, the variable amplifier control signal generating section 11 functions to generate the amplitude control signal that causes the amplification factor of the variable amplifier 2 to increase when the f/v sensitivity is shifted to the lower side and to decrease when the f/v sensitivity is shifted to the higher side.

Next, the internal configuration of the variable amplifier control signal generating section 11 will be described. The variable amplifier control signal generating section 11 comprises a voltage detection circuit 9 and a data latch circuit 10. The voltage detection circuit 9 receives the output of the low pass filter 8 which constitutes part of the PLL, and detects the output voltage level of the low pass filter 8 and compares it with a predetermined threshold voltage. The data latch circuit 10 receives the result of the comparison from the voltage detection circuit 9, holds the result of the comparison received from the voltage detection circuit 9, and outputs it as the amplitude control signal to the variable amplifier 2.

Here, a description will be given of how the variable amplifier control signal generating section 11 operates to detect the f/v sensitivity of the voltage controlled oscillator 4 and output the amplitude control signal. First, in a tuning step in the manufacturing process of the transmission signal generating apparatus, the voltage controlled oscillator 4 is tuned so that its output frequency becomes identical with the reference frequency when the applied frequency control voltage is the reference voltage.

Next, in a test mode, the output voltage of the low pass filter 8 when the voltage controlled oscillator 4 is operated at a detection frequency is detected by the voltage detection circuit 9, and the result of the comparison between the detected voltage and the predetermined threshold voltage is supplied to the data latch circuit 10. The data latch circuit 10 holds the result received from the voltage detection circuit 9, and outputs it as the amplitude control signal to the variable amplifier 2. The test mode is thus completed.

Figure 9:
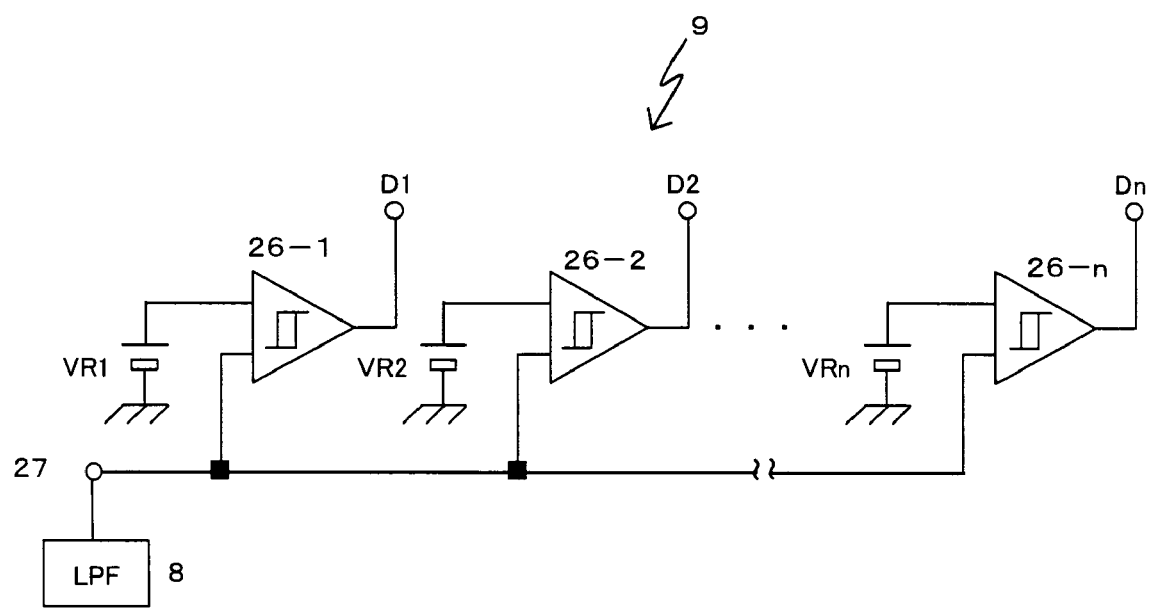
FIG. 9 is a circuit diagram showing a specific example of a voltage detection circuit according to the first embodiment of the present invention.

Next, the detailed configuration of the voltage detection circuit 9 will be described with reference to FIG. 9. In FIG. 9, reference numerals 26-1 to 26-n respectively indicate comparators having hysteresis characteristics, and reference numeral 27 denotes a detection target voltage, that is, the output of the low pass filter, while reference character VR1 designates a first threshold voltage source, VR2 a second threshold voltage source, VRn an nth threshold voltage source, D1 a first comparator output, D2 a second comparator output, and Dn an nth comparator output.

In this voltage detection circuit 9, the detection target voltage 27 is connected in common to the detection inputs of the n comparators 26-1 to 26-n. On the other hand, the first threshold voltage source VR1, the second threshold voltage source VR2, . . . , and the nth threshold voltage source VRn are connected respectively to the reference inputs of the n comparators 26-1 to 26-n. The first comparator output D1, the second comparator output D2, . . . , and the nth comparator output Dn are respectively the outputs of the comparators 26-1 to 26-n.

FIG. 10 is a table showing the input/output characteristic of the voltage detection circuit 9 when the voltage detection circuit 9 is constructed by connecting, for example, two comparators 26-1 and 26-2 so as to detect the level of the target voltage 27 by using two threshold values. When the detected target voltage 27 (this voltage is designated as Vt in the table) is smaller than the threshold voltage of the first threshold voltage source VR1 (the first threshold voltage is designated as VR1 in the table), the first comparator output D1 and the second comparator output D2 are both low L. On the other hand, when the detected target voltage 27 is equal to or greater than the threshold voltage of the first threshold voltage source VR1, but smaller than the threshold voltage of the second threshold voltage source VR2 (the second threshold voltage is designated as VR2 in the table), then the first comparator output D1 is high H and the second comparator output D2 is low L. Further, when the detected target voltage 27 is equal to or greater than the threshold voltage of the second threshold voltage source VR2, the first comparator output D1 and the second comparator output D2 are both high H. In this way, the voltage can be detected.

Figure 12:
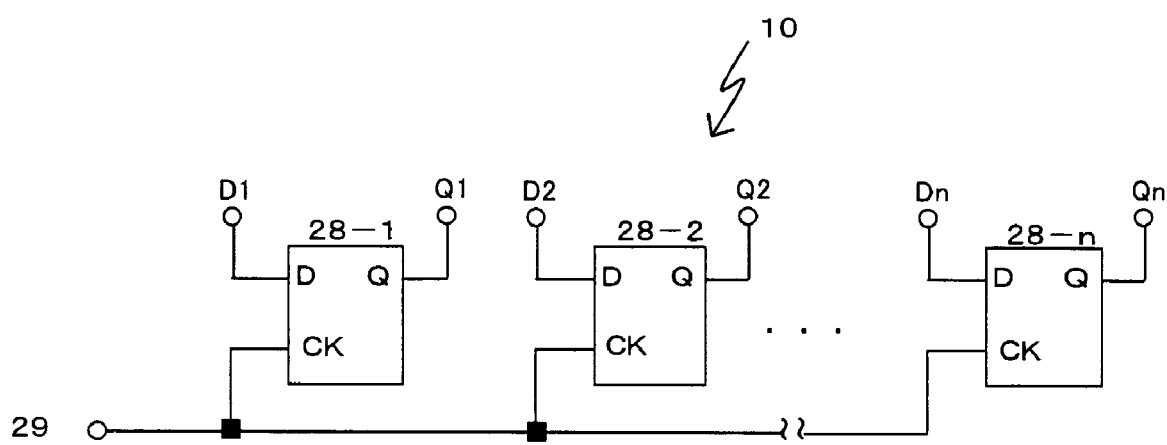
FIG. 12 is a circuit diagram showing a specific example of a data latch circuit according to the first embodiment of the present invention.

Next, the detailed configuration of the data latch circuit 10 will be described with reference to FIG. 12. In FIG. 12, the same constituent elements as those in FIG. 9 are designated by the same reference characters, and the description thereof will not be repeated here. In FIG. 12, reference numerals 28-1 to 28-n respectively indicate data flip-flops, and reference numeral 29 denotes a latch signal, while reference character Q1 designates a first control signal output, Q2 a second control signal output, and Qn an nth control signal output. The latch signal 29 is input externally. The latch signal 29 may be input from an external input terminal or input in the form of serial data from a CPU.

In this data latch circuit 10, the latch signal 29 provides a clock input CK to the n data flip-flops 28-1 to 28-n. The first comparator output D1, the second comparator output D2, . . . , and the nth comparator output Dn, i.e., the outputs of the n comparators 26-1 to 26-n shown in FIG. 9, are connected respectively to the data inputs D of the n data flip-flops 28-1 to 28-n. Further, the first control signal output Q1, the second control signal output Q2, . . . , and the nth control signal output Qn are connected respectively to the outputs Q of the n data flip-flops 28-1 to 28-n.

In the data latch circuit 10, the signals input from the first comparator output D1, the second comparator output D2, . . . , and the nth comparator output Dn, i.e., the outputs of the n comparators 26-1 to 26-n, are latched internally by the rising edge of the latch signal 29 and are output at the first control signal output Q1, the second control signal output Q2, . . . , and the nth control signal output Qn, the output signals being held until the next rising transition of the latch signal 29.

Figure 13:
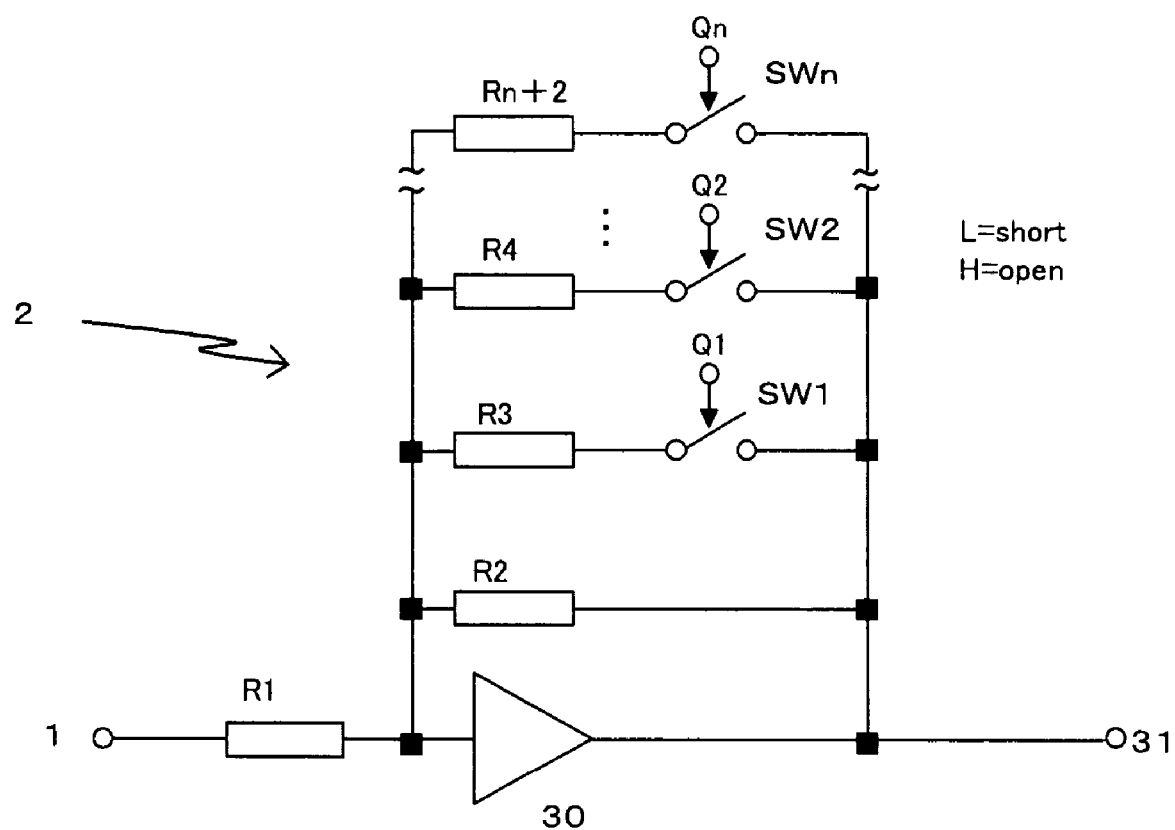
FIG. 13 is a circuit diagram showing a specific example of a variable amplifier according to the first embodiment of the present invention.

Next, the detailed configuration of the variable amplifier 2 will be described with reference to FIG. 13. In FIG. 13, the same constituent elements as those in FIGS. 1 and 12 are designated by the same reference numerals, and the description thereof will not be repeated here. Reference numeral 30 indicates an operational amplifier, and reference numeral 31 designates a variable amplifier output, while reference character R1 denotes a first resistor, R2 a second resistor, R3 a third resistor, R4 a fourth resistor, R(n+2) an (n+2)th resistor, SW1 a first switch, SW2 a second switch, and SWn an nth switch.

In this variable amplifier 2, the first switch SW1 whose on/off operation is controlled by the first control signal output Q1 from the data latch circuit 10 shown in FIG. 12 is connected in series to the third resistor R3; likewise, the second switch SW2 whose on/off operation is controlled by the second control signal output Q2 is connected in series to the fourth resistor R4, and the nth switch SWn whose on/off operation is controlled by the nth control signal output Qn is connected in series to the (n+2)th resistor R(n+2). Then, the n series circuits formed by these switches and resistors are connected in parallel with the second resistor R2, thus forming a parallel circuit which acts as a feedback section for the operational amplifier 30. Further, the first resistor R1 is connected to the input of the operational amplifier 30 so that the voice signal is input to the operational amplifier 30 via the first resistor R1, and the amplified voice signal is output at the variable amplifier output 31.

The first switch SW1, the second switch SW2, . . . , and the nth switch SWn are each constructed to close when a corresponding one of the first control signal output Q1, the second control signal output Q2, . . . , and the nth control signal output Qn is low L, and to open when the corresponding control signal output is high H.

FIG. 14 is a table showing how the amplification factor of the variable amplifier 2 changes in a configuration where two control signals are input to the variable amplifier 2 of FIG. 13 so that the amplification factor can be adjusted between three settings.

Here, when Q1=L and Q2=L, the amplification factor of the variable amplifier 2 is given by equation (1) below.

Amplification factor=$(1/(1/R2+1/R3+1/R4))/R1$ (1)

Likewise, when Q1=H and Q2=L, the amplification factor of the variable amplifier 2 is given by equation (2) below.

Amplification factor=$(1/(1/R2+1/R4))/R1$ (2)

Further, when Q1=H and Q2=H, the amplification factor of the variable amplifier 2 is given by equation (3) below.

Amplification factor=$R2/R1$ (3)

In the equations (1), (2), and (3), the same constituent elements as those in FIG. 13 are designated by the same reference characters, and the description thereof will not be repeated here.

Figure 18:
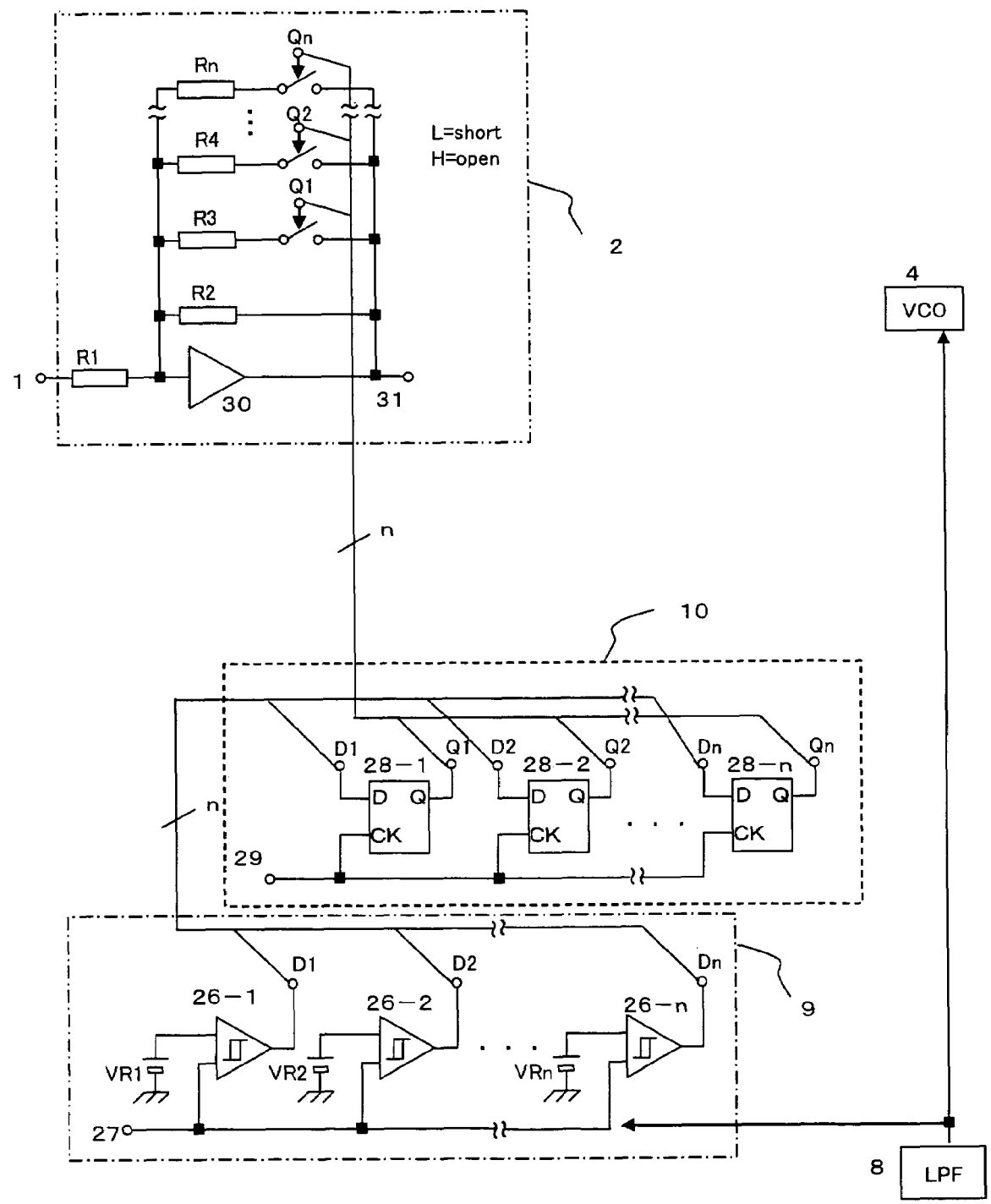
FIG. 18 is a connection diagram of individual circuit blocks in a variable amplifier automatic adjusting section according to the first embodiment of the present invention.

Next, the detailed configuration of the variable amplifier automatic adjusting section 12 will be described with reference to FIG. 18. As shown in FIG. 18, the variable amplifier automatic adjusting section 12 employs the configuration of FIG. 9 for the voltage detection circuit 9, the configuration of FIG. 12 for the data latch circuit 10, and the configuration of FIG. 13 for the variable amplifier 2.

The output of the low pass filter 8, which is input to the voltage controlled oscillator 4, is also input as the detection target voltage 27 to the voltage detection circuit 9 shown in FIG. 9. The results of the detection by the voltage detection circuit 9 are output at the first comparator output D1, the second comparator output D2, . . . , and the nth comparator output Dn, which are connected to the corresponding inputs designated by the same reference characters in the data latch circuit 10 shown in FIG. 12. The data latch circuit 10, in response to the rising edge of the latch signal 29, outputs the signals at the first control signal output Q1, the second control signal output Q2, . . . , and the nth control signal output Qn, holds the output signals until the next rising transition of the latch signal 29, and then supplies the output signals to the first switch SW1, the second switch SW2, . . . , and the nth switch SWn, respectively, in the variable amplifier 2 shown in FIG. 13.

Figure 11:
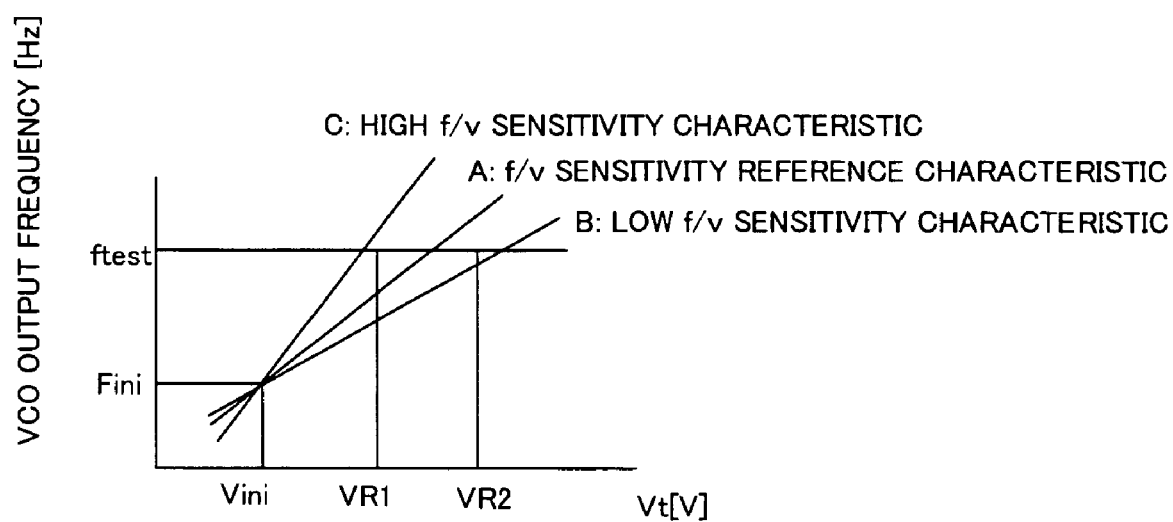
FIG. 11 is a characteristic diagram showing how the f/v sensitivity of a voltage controlled oscillator is detected according to the first embodiment of the present invention.

FIG. 11 shows an example of a characteristic diagram depicting how the f/v sensitivity of the voltage controlled oscillator 4 is detected when the voltage detection circuit 9 shown in FIG. 9 is constructed by connecting two comparators 26-1 and 26-2 so as to detect the voltage level by using two threshold values.

The operations for detecting the f/v sensitivity of the voltage controlled oscillator 4 and outputting the amplitude control signals by using the voltage detection circuit 9 shown in FIG. 9 and the data latch circuit 10 shown in FIG. 12 will be described with reference to FIG. 11.

In a tuning step in the manufacturing process of the transmission signal generating apparatus, the voltage controlled oscillator 4 is tuned to the reference frequency designated "Fini" (system reference channel) in FIG. 11 when the PLL lock voltage Vt is the reference voltage designated "Vini". In this condition, as a test mode for detecting the f/v sensitivity of the voltage controlled oscillator 4, the PLL lock frequency is set to the detection frequency designated "ftest". Then, the output of the low pass filter 8 when the PLL is locked is detected as a voltage by the voltage detection circuit 9. More specifically, which one of the f/v sensitivity characteristics shown in FIG. 11, the f/v sensitivity reference characteristic A, the low f/v sensitivity characteristic B, or the high f/v sensitivity characteristic C, corresponds to the f/v sensitivity of the voltage controlled oscillator 4 is determined by detecting in which one of the three voltage ranges defined by the two threshold values the output voltage of the low pass filter lies when the voltage controlled oscillator 4 is operated at the detection frequency ftest.

The data latch circuit 10 receives the outputs of the voltage detection circuit 9 and, in response to the rising edge of the latch signal 29, outputs the received signals, i.e., the first comparator output D1 and the second comparator output D2, at the first control signal output Q1 and the second control signal output Q2, respectively; the output signals are held until the next rising transition of the latch signal 29, and then applied as the amplitude control signals to the variable amplifier 2. The test mode is thus completed, completing the operation for outputting the amplitude control signals. Here, the test mode is a mode for measuring the f/v sensitivity, and the latch signal 29 is a signal for holding the results obtained in the test mode.

Figure 21:
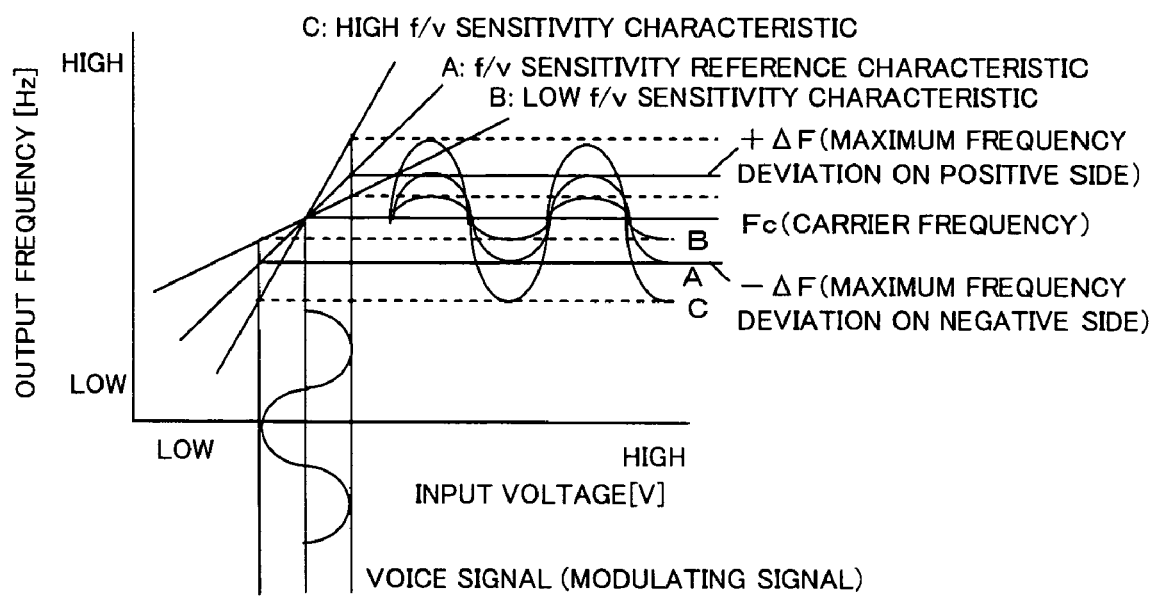
FIG. 21 is a diagram for explaining how the frequency deviation changes due to variations in f/v sensitivity.
Figure 22:
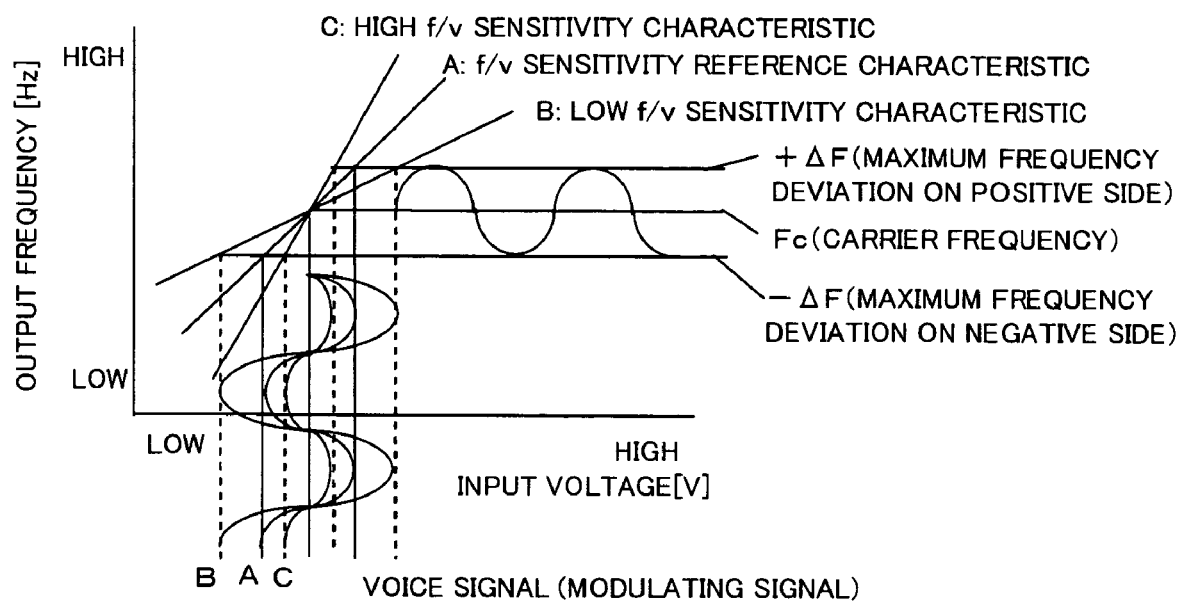
FIG. 22 is a diagram for explaining the effect of the present invention.

According to the above configuration which controls the amplification factor of the variable amplifier 2, even when the f/v sensitivity of the voltage controlled oscillator 4 is shifted toward the lower side as shown by the low f/v sensitivity characteristic B in FIG. 21 as in the prior art, the frequency deviation at the time of modulation can be prevented from decreasing, by performing control to increase the amplification factor of the variable amplifier 2 as shown by the low f/v sensitivity characteristic B in FIG. 22. As a result, the modulation can be set to the maximum value of the given frequency band shown by the f/v sensitivity reference characteristic A in FIG. 21, and thus the voice signal can be transmitted with high transmission quality by making maximum use of the transmission frequency band.

Further according to the above configuration which controls the amplification factor of the variable amplifier 2, the frequency deviation at the time of modulation can also be accommodated within the given transmission frequency band.

Embodiment 2

Figure 2:
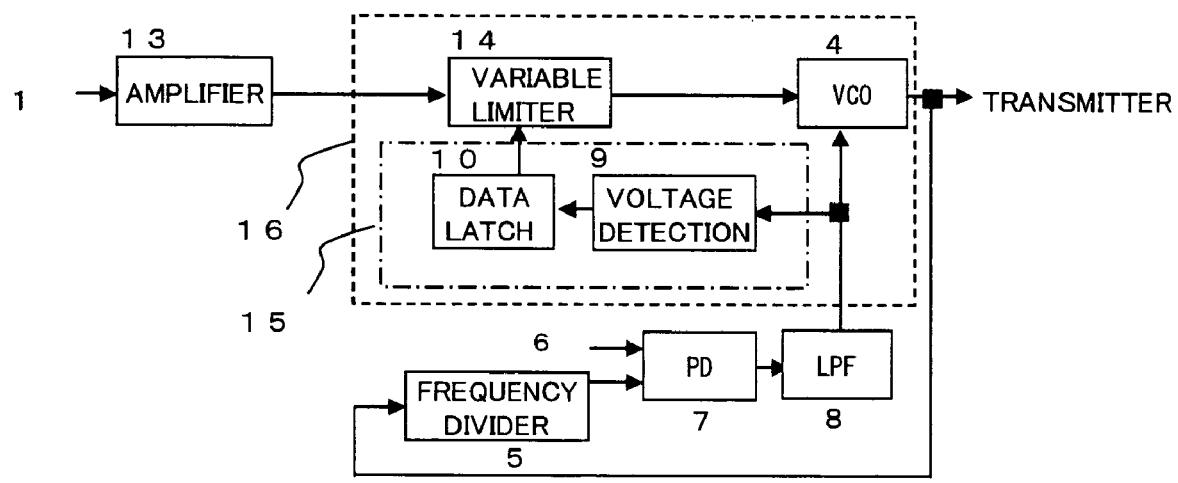
FIG. 2 is a block diagram of a transmission signal generating apparatus according to a second embodiment of the present invention.

FIG. 2 is a block diagram showing a transmission signal generating apparatus according to a second embodiment of the present invention. In FIG. 2, the same constituent elements as those in FIGS. 1 and 6 are designated by the same reference numerals, and the description thereof will not be repeated here.

In FIG. 2, reference numeral 14 indicates a variable limiter, reference numeral 15 a variable limiter control signal generating section, and reference numeral 16 a variable limiter automatic adjusting section.

The known PLL comprising the phase comparator 7, reference signal 6, voltage controlled oscillator 4, frequency divider 5, and low pass filter 8 is the same as that shown in FIG. 6, and therefore, will not be described here.

The voice signal 1 is amplified by the amplifier 13 whose output is coupled to the variable limiter 14 which constitutes part of the variable limiter automatic adjusting section 16.

The variable limiter automatic adjusting section 16 comprises the variable limiter 14, the variable limiter control signal generating section 15, and the voltage controlled oscillator 4. The variable limiter 14 limits the amplitude of the voice signal, and outputs it as a modulating signal to the voltage controlled oscillator 4. The variable limiter control signal generating section 15 receives the output of the low pass filter which constitutes part of the PLL, and generates an amplitude control signal for the variable limiter 14 by detecting the f/v sensitivity of the voltage controlled oscillator 4. The variable limiter 14 varies its amplitude limiting range in accordance with the amplitude control signal.

Here, the variable limiter control signal generating section 15 functions to generate the amplitude control signal that causes the amplitude limiting range of the variable limiter 14 to become wider when the f/v sensitivity is shifted to the lower side and to become narrower when the f/v sensitivity is shifted to the higher side.

Next, the internal configuration of the variable limiter control signal generating section 15 will be described. The variable limiter control signal generating section 15 comprises the voltage detection circuit 9 and the data latch circuit 10. The voltage detection circuit 9 receives the output of the low pass filter 8 which constitutes part of the PLL, and detects the output voltage level of the low pass filter 8 and compares it with a predetermined threshold voltage. The data latch circuit 10 receives the result of the comparison from the voltage detection circuit 9, holds the result of the comparison received from the voltage detection circuit 9, and outputs it as the amplitude control signal to the variable limiter 14.

Here, a description will be given of how the variable limiter control signal generating section 15 operates to detect the f/v sensitivity of the voltage controlled oscillator 4 and output the amplitude control signal. First, in a tuning step in the manufacturing process of the transmission signal generating apparatus, the voltage controlled oscillator 4 is tuned so that its output frequency becomes identical with the reference frequency when the applied frequency control voltage is the reference voltage.

Next, in a test mode, the output voltage of the low pass filter 8 when the voltage controlled oscillator 4 is operated at a detection frequency is detected by the voltage detection circuit 9, and the result of the comparison between the detected voltage and the predetermined threshold voltage is supplied to the data latch circuit 10. The data latch circuit 10 holds the result received from the voltage detection circuit 9, and outputs it as the amplitude control signal to the variable limiter 14. The test mode is thus completed.

Figure 15:
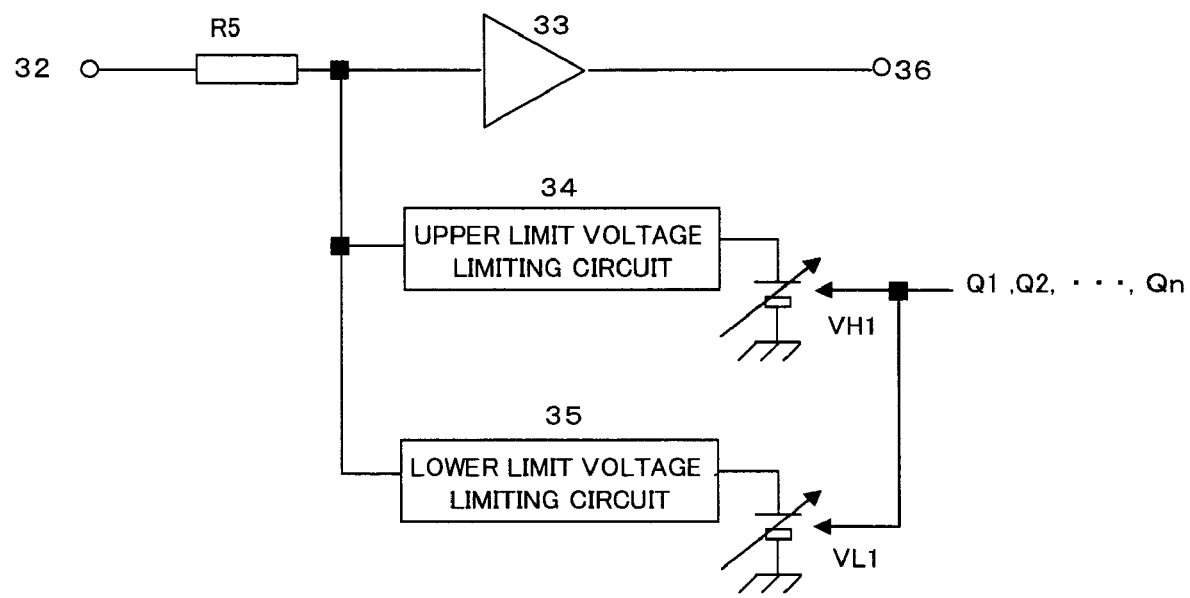
FIG. 15 is a circuit diagram showing a specific example of a variable limiter according to the second embodiment of the present invention.

Next, the detailed configuration of the variable limiter 14 will be described with reference to FIG. 15. In FIG. 15, reference numeral 32 indicates a limiter input, reference numeral 33 a buffer amplifier, reference numeral 34 an upper limit voltage limiting circuit, reference numeral 35 a lower limit voltage limiting circuit, and reference numeral 36 a limiter output, while reference character R5 designates a fifth resistor, VH1 an upper limit limiting voltage source, and VL1 a lower limit limiting voltage source.

The limiter input 32 at which the voice signal is input is connected to one end of the fifth resistor R5. The other end of the fifth resistor R5 is connected to the upper limit voltage limiting circuit 34 which limits the upper limit value of the amplitude, the lower limit voltage limiting circuit 35 which limits the lower limit value of the amplitude, and the input of the buffer amplifier 33. The output of the buffer amplifier 33 is connected to the limiter output 36.

The upper limit voltage limiting circuit 34 is connected to the upper limit limiting voltage source VH1 which controls the upper limit limiting voltage based on the first control signal output Q1, second control signal output Q2, . . . , and nth control signal output Qn, while the lower limit voltage limiting circuit 35 is connected to the lower limit limiting voltage source VL1 which controls the lower limit limiting voltage based on the first control signal output Q1, second control signal output Q2, . . . , and nth control signal output Qn.

After the voice signal has passed through the fifth resistor R5, the amplitude of the voice signal is limited by the upper limit voltage limiting circuit 34 and the lower limit voltage limiting circuit 35 within a range whose upper limit is set by the upper limit limiting voltage source VH1 that controls the upper limit limiting voltage based on the first control signal output Q1, second control signal output Q2, . . . , and nth control signal output Qn, and whose lower limit is set by the lower limit limiting voltage source VL1 that controls the lower limit limiting voltage based on the first control signal output Q1, second control signal output Q2, . . . , and nth control signal output Qn. Then, in this condition, the output of the buffer amplifier 33 is transferred to the limiter output 36.

Figure 16:
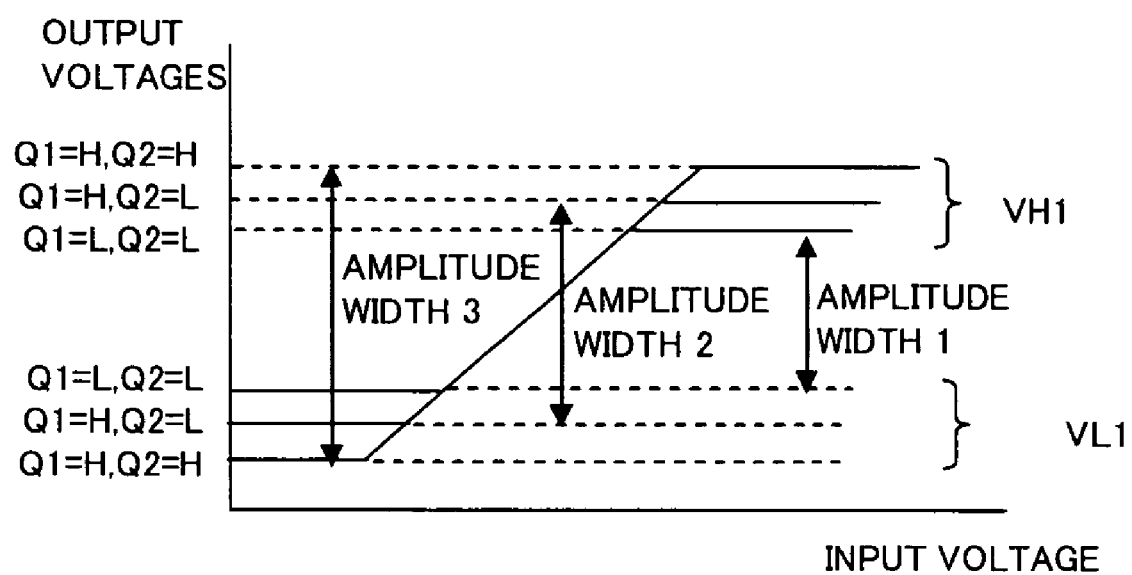
FIG. 16 is a diagram showing the input/output characteristics of the variable limiter according to the second embodiment of the present invention.

FIG. 16 is a diagram showing the input/output characteristic of the variable limiter 14 when two amplitude control signals are input to the variable limiter of FIG. 15 so that the amplitude limiting range can be adjusted between three settings, and FIG. 17 is a table showing how the amplitude limiting range of the variable limiter 14 changes when two amplitude control signals are input to the variable limiter of FIG. 15 so as to be able to adjust the amplitude limiting range between three settings.

When Q1=L and Q2=L, the amplitude limiting range of the variable limiter 14 is given by the amplitude range 1 shown in FIGS. 16 and 17.

When Q1=H and Q2=L, the amplitude limiting range of the variable limiter 14 is given by the amplitude range 2 shown in FIGS. 16 and 17.

When Q1=H and Q2=H, the amplitude limiting range of the variable limiter 14 is given by the amplitude range 3 shown in FIGS. 16 and 17.

Figure 19:
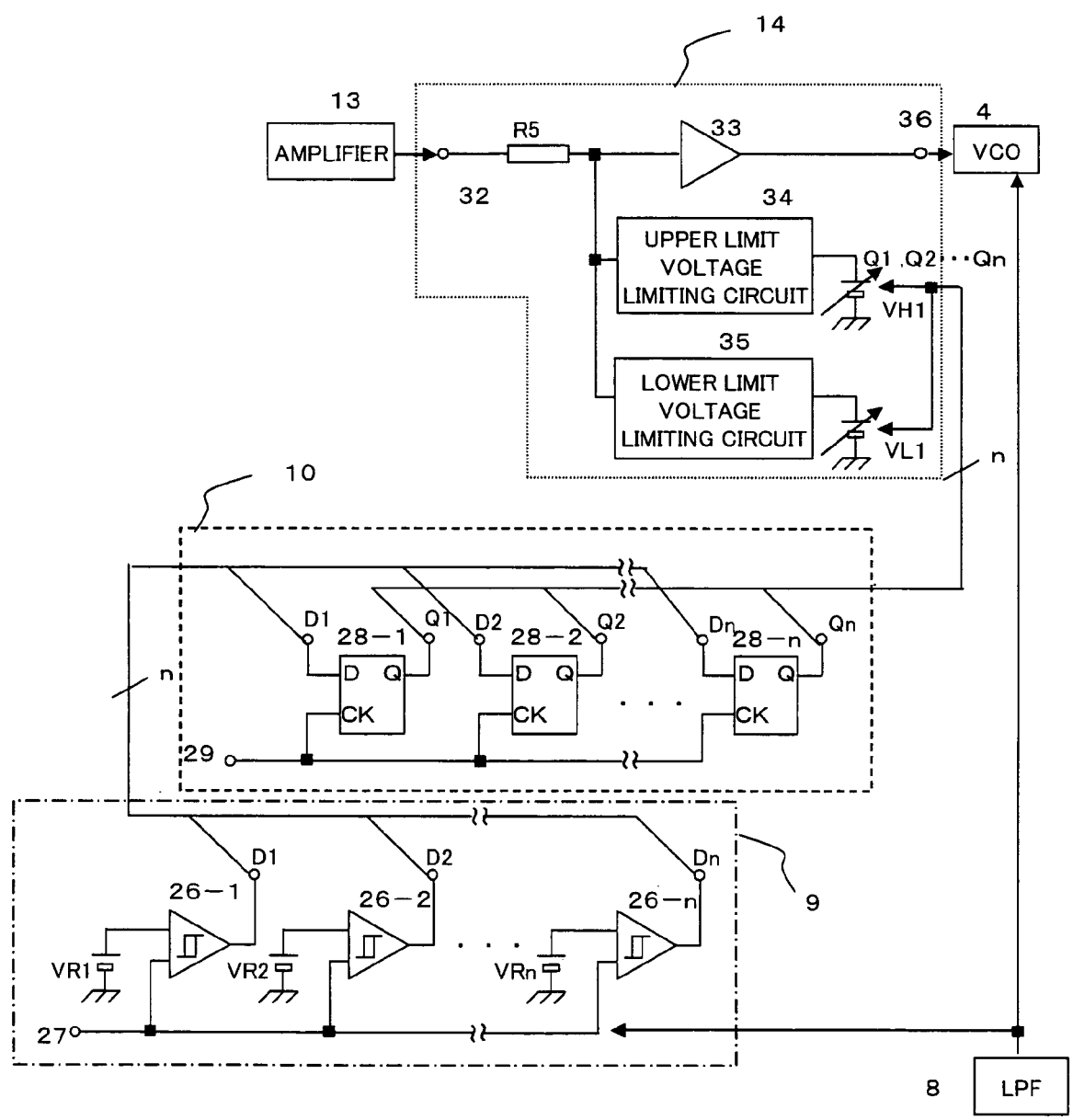
FIG. 19 is a connection diagram of individual circuit blocks in a variable limiter automatic adjusting section according to the second embodiment of the present invention.

Next, the detailed configuration of the variable limiter automatic adjusting section 16 will be described with reference to FIG. 19. The variable limiter automatic adjusting section 16 employs the configuration of FIG. 9 for the voltage detection circuit 9, the configuration of FIG. 12 for the data latch circuit 10, and the configuration of FIG. 15 for the variable limiter 14.

The output of the low pass filter 8, which is input to the voltage controlled oscillator 4, is also input as the detection target voltage 27 to the voltage detection circuit 9 shown in FIG. 9. The results of the detection by the voltage detection circuit 9 are output at the first comparator output D1, the second comparator output D2, . . . , and the nth comparator output Dn, which are connected to the corresponding inputs designated by the same reference characters in the data latch circuit 10 shown in FIG. 12. The data latch circuit 10, in response to the rising edge of the latch signal 29, outputs the signals at the first control signal output Q1, the second control signal output Q2, . . . , and the nth control signal output Qn, holds the output signals until the next rising transition of the latch signal 29, and then supplies the output signals to the upper limit limiting voltage source VH1 and the lower limit limiting voltage source VL1 in the variable limiter 14 shown in FIG. 15.

The operations for detecting the f/v sensitivity of the voltage controlled oscillator 4 and outputting the amplitude control signals by using the voltage detection circuit 9 shown in FIG. 9 and the data latch circuit 10 shown in FIG. 12 are the same as those in the first embodiment, and will not be described herein.

According to the above configuration which controls the amplitude limiting range of the variable limiter 14 by the amplitude control signal output from the data latch circuit 10 shown in FIG. 12, when the f/v sensitivity characteristic of the voltage controlled oscillator 4 is shifted toward the higher side as shown by the high f/v sensitivity characteristic C in FIG. 21, the amplitude limiting range of the variable limiter is reduced as shown by the high f/v sensitivity characteristic C in FIG. 22; this serves to prevent the frequency deviation at the time of modulation from increasing and exceeding the given frequency band. As a result, the modulation can be set to the maximum value of the given frequency band shown by the f/v sensitivity reference characteristic A in FIG. 21, and thus the frequency deviation at the time of modulation can be accommodated within the given transmission frequency band.

Further according to the above configuration which controls the amplitude limiting range of the variable limiter 14, the voice signal can also be transmitted with high transmission quality by making maximum use of the transmission frequency band.

Embodiment 3

Figure 3:
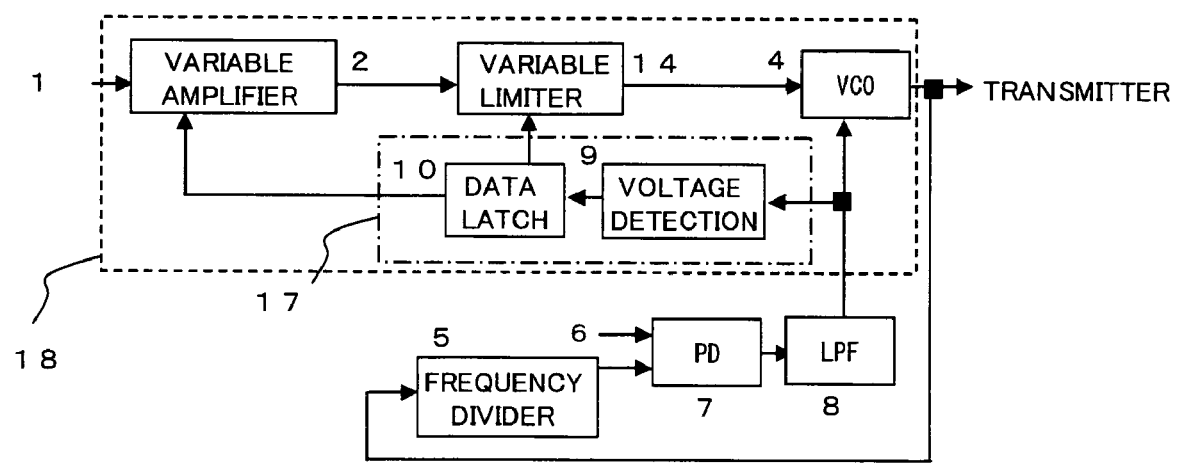
FIG. 3 is a block diagram of a transmission signal generating apparatus according to a third embodiment of the present invention.

FIG. 3 is a block diagram showing a transmission signal generating apparatus according to a third embodiment of the present invention. In FIG. 3, the same constituent elements as those in FIGS. 1, 2, and 6 are designated by the same reference numerals, and the description thereof will not be repeated here. In FIG. 3, reference numeral 17 indicates a control signal generating section, and reference numeral 18 an automatic adjusting section.

The known PLL comprising the phase comparator 7, reference signal 6, voltage controlled oscillator 4, frequency divider 5, and low pass filter 8 is the same as that shown in FIG. 6, and therefore, will not be described here.

The automatic adjusting section 18 comprises the variable amplifier 2 which amplifies the voice signal, the variable limiter 14 which limits the amplitude of the voice signal and outputs the voice signal as a modulating signal to the voltage controlled oscillator 4, the control signal generating section 17 which generates amplitude control signals for the variable amplifier 2 and the variable limiter 14, and the voltage controlled oscillator 4. The variable amplifier 2 varies its amplification factor in accordance with the amplitude control signal. The variable limiter 14 limits the amplitude of the voice signal by varying the amplitude limiting range in accordance with the amplitude control signal, and outputs the voice signal as the modulating signal to the voltage controlled oscillator 4. The control signal generating section 17 receives the outputs of the variable limiter 14 and the voltage controlled oscillator 4 that constitutes part of the PLL, and generates the amplitude control signals for the variable amplifier 2 and the variable limiter 14 by detecting the f/v sensitivity of the voltage controlled oscillator 4.

Here, the control signal generating section 17 has the function of generating the amplitude control signal that causes the amplification factor of the variable amplifier 2 to increase when the f/v sensitivity is shifted to the lower side and to decrease when the f/v sensitivity is shifted to the higher side, as well as the function of generating the amplitude control signal that causes the amplitude limiting range of the variable limiter 14 to become wider when the f/v sensitivity is shifted to the lower side and to become narrower when the f/v sensitivity is shifted to the higher side.

Next, the internal configuration of the control signal generating section 17 will be described. The control signal generating section 17 comprises the voltage detection circuit 9 and the data latch circuit 10. The voltage detection circuit 9 receives the output of the low pass filter 8 which constitutes part of the PLL, and detects the output voltage level of the low pass filter 8 and compares it with a predetermined threshold voltage. The data latch circuit 10 receives the result of the comparison from the voltage detection circuit 9, holds the result of the comparison received from the voltage detection circuit 9, and outputs it as the amplitude control signal to the variable amplifier 2 and the variable limiter 14.

Here, a description will be given of how the control signal generating section 17 operates to detect the f/v sensitivity of the voltage controlled oscillator 4 and output the amplitude control signal. First, in a tuning step in the manufacturing process of the transmission signal generating apparatus, the voltage controlled oscillator 4 is tuned so that its output frequency becomes identical with the reference frequency when the applied frequency control voltage is the reference voltage.

Next, in a test mode, the output voltage of the low pass filter 8 when the voltage controlled oscillator 4 is operated at a detection frequency is detected by the voltage detection circuit 9, and the result of the comparison between the detected voltage and the predetermined threshold voltage is supplied to the data latch circuit 10. The data latch circuit 10 holds the result received from the voltage detection circuit 9, and outputs it as the amplitude control signal to the variable amplifier 2 and the variable limiter 14. The test mode is thus completed.

Figure 20:
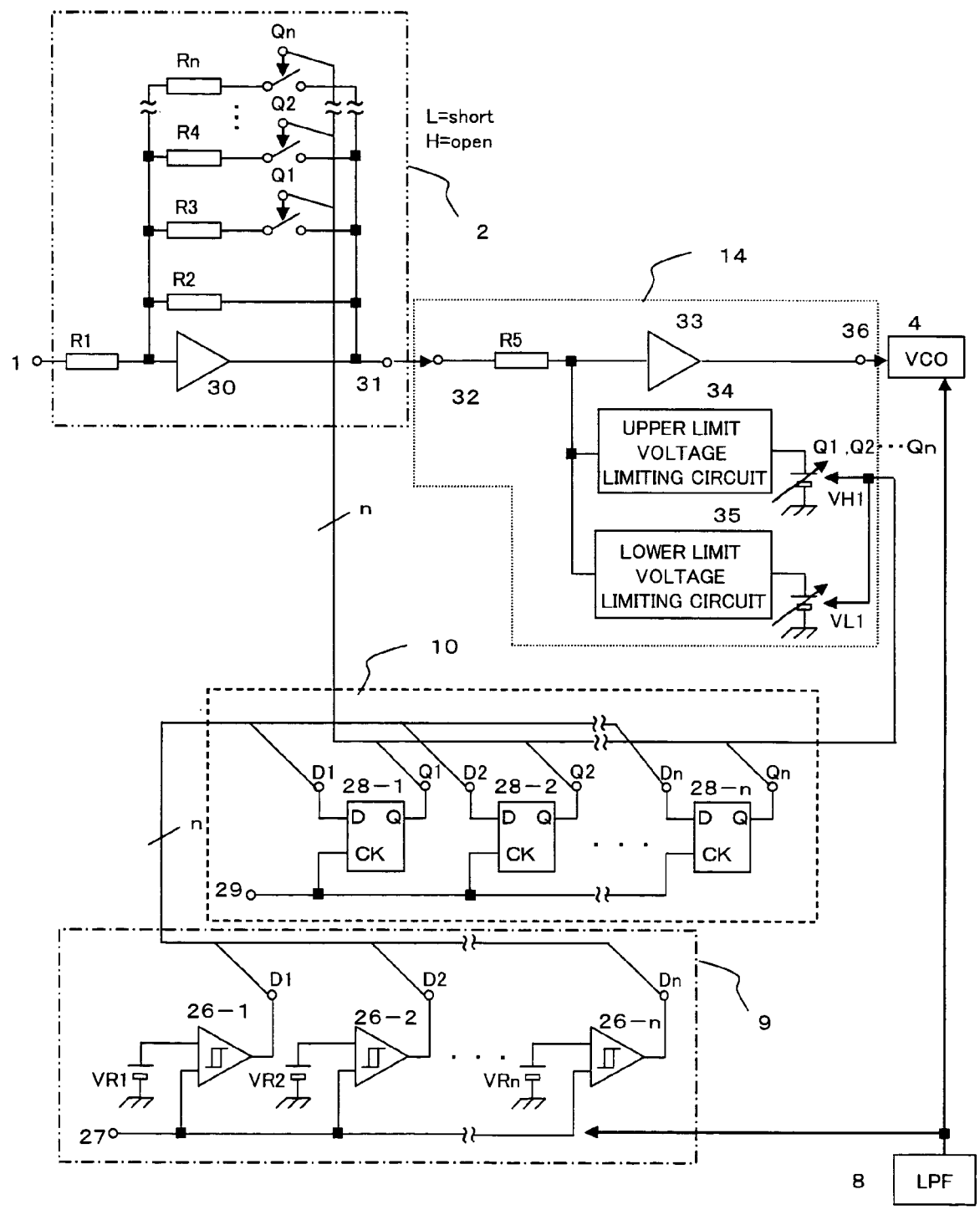
FIG. 20 is a connection diagram of individual circuit blocks in an automatic adjusting section according to the third embodiment of the present invention.

Next, the detailed configuration of the automatic adjusting section 18 will be described with reference to FIG. 20. The automatic adjusting section 18 employs the configuration of FIG. 9 for the voltage detection circuit 9, the configuration of FIG. 12 for the data latch circuit 10, the configuration of FIG. 13 for the variable amplifier 2, and the configuration of FIG. 15 for the variable limiter 14.

The output of the low pass filter 8, which is input to the voltage controlled oscillator 4, is also input as the detection target voltage 27 to the voltage detection circuit 9 shown in FIG. 9. The results of the detection by the voltage detection circuit 9 are output at the first comparator output D1, the second comparator output D2, . . . , and the nth comparator output Dn, which are connected to the corresponding inputs designated by the same reference characters in the data latch circuit 10 shown in FIG. 12. The data latch circuit 10, in response to the rising edge of the latch signal 29, outputs the signals at the first control signal output Q1, the second control signal output Q2, . . . , and the nth control signal output Qn, holds the output signals until the next rising transition of the latch signal 29, and then supplies the output signals to the variable amplifier shown in FIG. 13 as well as to the upper limit limiting voltage source VH1 and the lower limit limiting voltage source VL1 in the variable limiter 14 shown in FIG. 15.

The operations for detecting the f/v sensitivity of the voltage controlled oscillator 4 and outputting the amplitude control signals by using the voltage detection circuit 9 shown in FIG. 9 and the data latch circuit 10 shown in FIG. 12 are the same as those in the first embodiment, and will not be described herein.

FIG. 23 is a table showing the correspondences among the results of the detection by the voltage detection circuit 9 shown in FIG. 9, the outputs of the data latch circuit 10 shown in FIG. 12, the change of the amplification factor of the variable amplifier, and the change of the amplitude limiting range of the variable limiter. The change of the amplification factor of the variable amplifier here shows the change of the amplification factor when two amplitude control signals are input to the variable amplifier 2 of FIG. 12 so as to be able to adjust the amplification factor between three settings. Likewise, the change of the amplitude limiting range of the variable limiter here shows the change of the amplitude limiting range when two amplitude control signals are input to the variable limiter 14 of FIG. 15 so as to be able to adjust the amplitude limiting range between three settings.

The operation of the variable amplifier 2 is the same as that of the first embodiment, and the operation of the variable limiter 14 is the same as that of the second embodiment; therefore, the description thereof will not be repeated here.

According to the above configuration which controls the amplification factor of the variable amplifier 2 and the amplitude limiting range of the variable limiter 14 by the amplitude control signals output from the data latch circuit 10 shown in FIG. 12, when the f/v sensitivity of the voltage controlled oscillator 4 is shifted toward the lower side as shown by the low f/v sensitivity characteristic B in FIG. 21, the amplification factor of the variable amplifier is increased as shown by the low f/v sensitivity characteristic B in FIG. 22; this serves to prevent the frequency deviation at the time of modulation from becoming small. As a result, the modulation can be set to the maximum value of the given frequency band shown by the f/v sensitivity reference characteristic A in FIG. 21.

On the other hand, when the f/v sensitivity characteristic of the voltage controlled oscillator 4 is shifted toward the higher side as shown by the high f/v sensitivity characteristic C in FIG. 21, the amplitude limiting range of the variable limiter is reduced as shown by the high f/v sensitivity characteristic C in FIG. 22; this serves to prevent the frequency deviation at the time of modulation from increasing and exceeding the given frequency band. As a result, the modulation can be set to the maximum value of the given frequency band shown by the f/v sensitivity reference characteristic A in FIG. 21.

Accordingly, the voice signal can be transmitted with high transmission quality by making maximum use of the transmission frequency band, and at the same time, the frequency deviation at the time of modulation can be accommodated within the given transmission frequency band.

Embodiment 4

Figure 4:
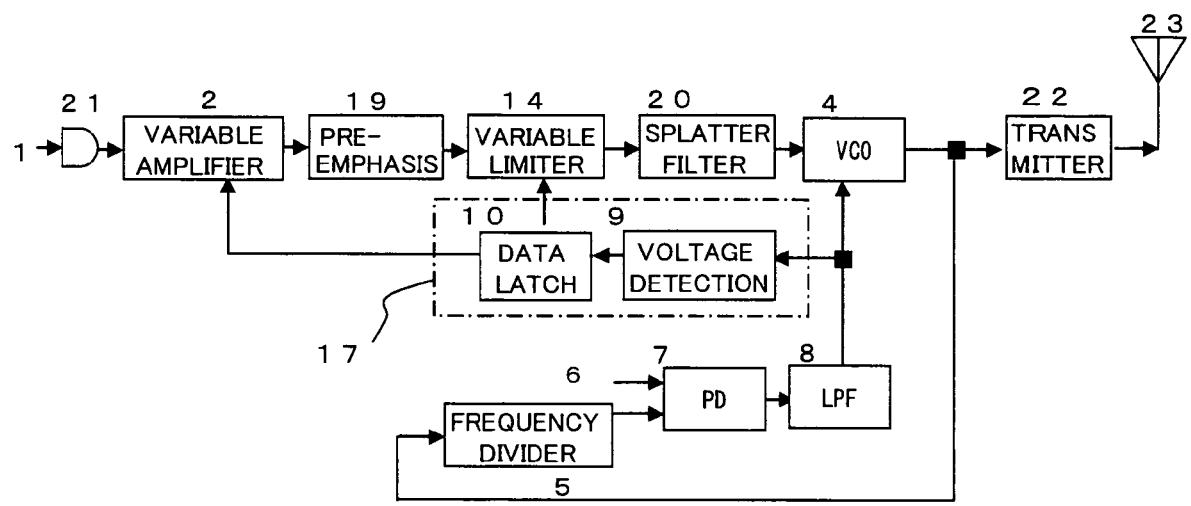
FIG. 4 is a block diagram of a transmission signal generating apparatus according to a fourth embodiment of the present invention.

FIG. 4 is a block diagram showing a transmission signal generating apparatus according to a fourth embodiment of the present invention. In FIG. 4, the same constituent elements as those in FIGS. 3 and 6 are designated by the same reference numerals, and the description thereof will not be repeated here. In FIG. 4, reference numeral 21 indicates a microphone, reference numeral 22 a transmitter, and reference numeral 23 an antenna.

The fourth embodiment differs from the transmission signal generating apparatus of the third embodiment by the inclusion of the microphone 21 which is connected to the input of the variable amplifier 2, a pre-emphasis circuit 19 which is inserted between the variable amplifier 2 and the variable limiter 14, a splatter filter 20 which is inserted between the variable limiter 14 and the voltage controlled oscillator 4, and the transmitter 23 and antenna 23 which are connected on the output side of the voltage controlled oscillator 4. Therefore, the same constituent elements as those in the transmission signal generating apparatus of the third embodiment will not be described here.

Figure 7:
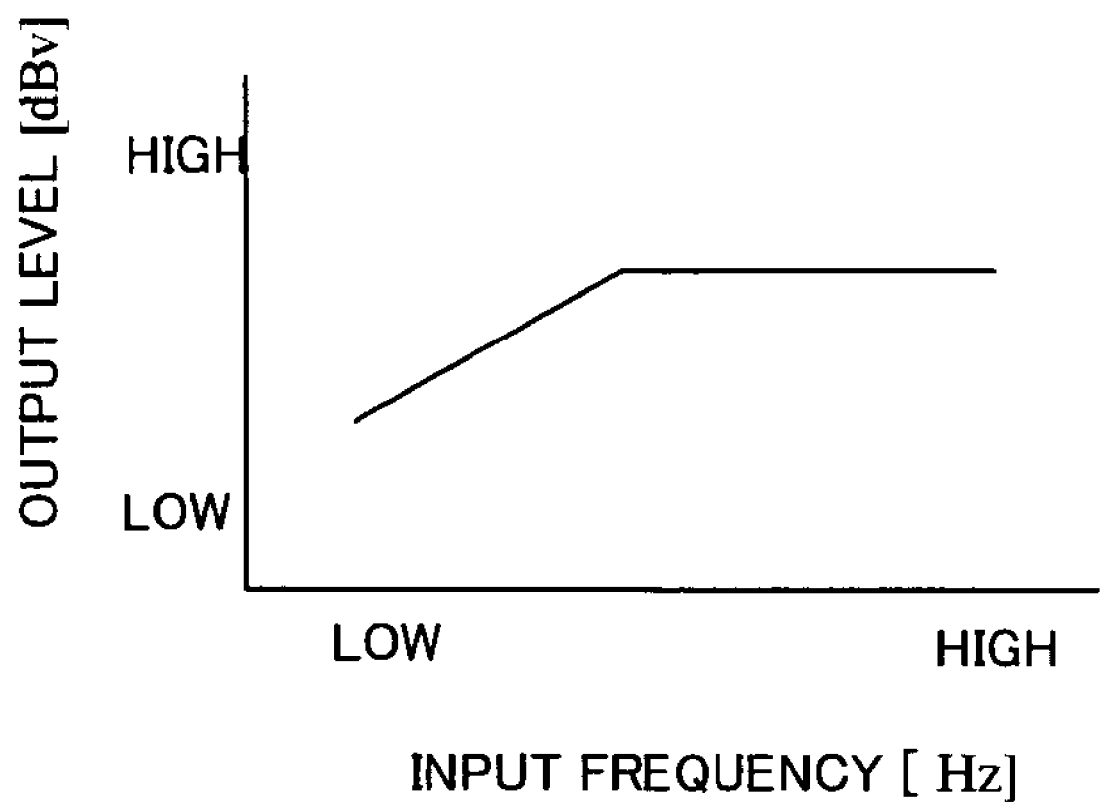
FIG. 7 is a diagram showing the frequency characteristic of a pre-emphasis circuit.
Figure 8:
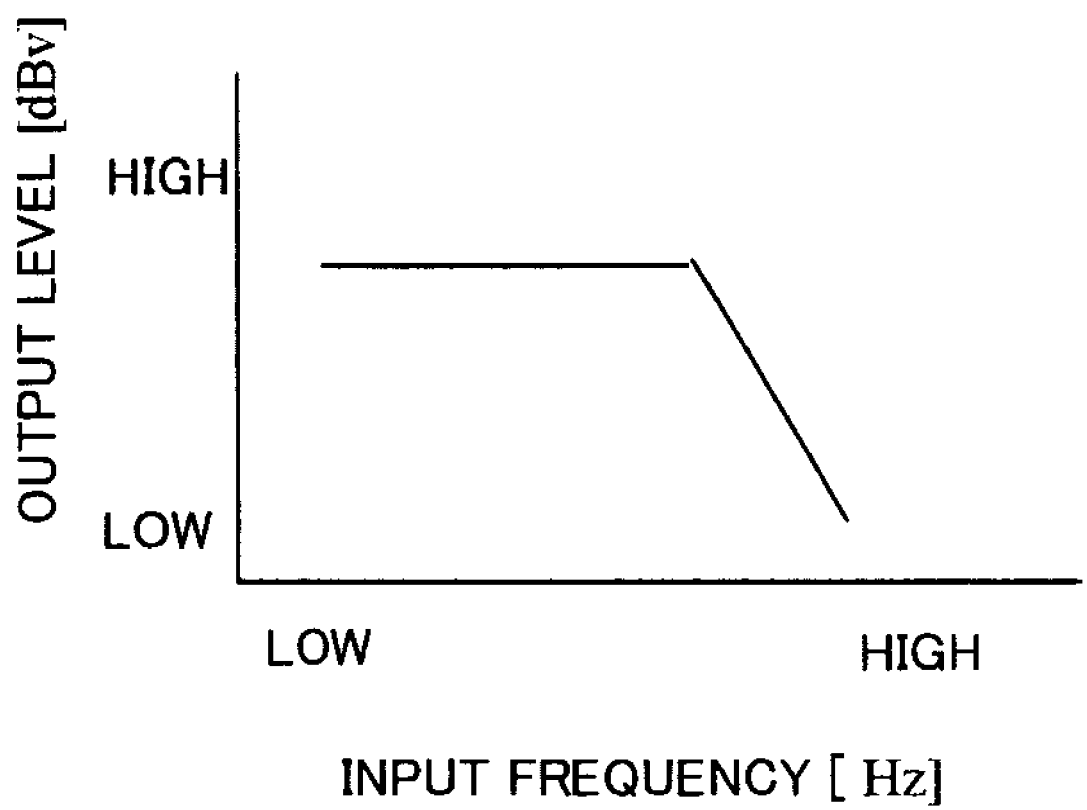
FIG. 8 is a diagram showing the frequency characteristic of a splatter filter.

The voice signal 1 is input to the microphone 21, and the output of the microphone 21 is fed into the variable amplifier 2 for amplification, after which its higher frequencies are emphasized by the pre-emphasis circuit 19 having the frequency characteristic shown in FIG. 7, and the resulting signal is passed through the variable limiter 14 where the amplitude is limited; then, the signal is passed through the splatter filter 20 having the frequency characteristic shown in FIG. 8, where unwanted high frequencies contained in the voice signal are limited, and the resulting signal is output as a modulating signal to the voltage controlled oscillator 4. The modulated transmission signal output from the voltage controlled oscillator 4 is fed to the transmitter 22 where the signal is limited within the given transmission frequency band, amplified, and radiated from the antenna 23 into space.

This embodiment offers the same effect as that achieved in the third embodiment.

Embodiment 5

Figure 5:
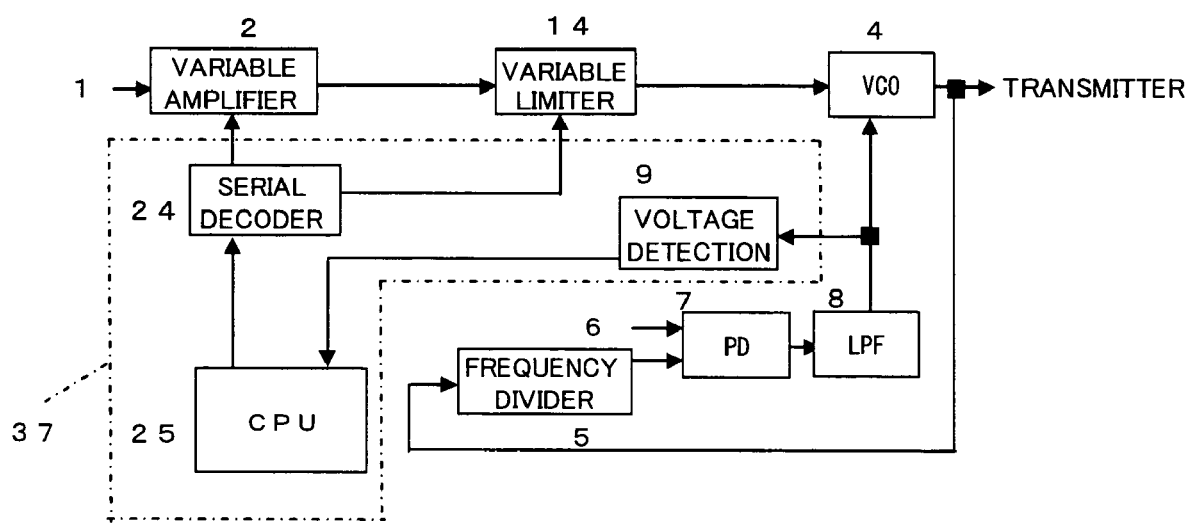
FIG. 5 is a block diagram of a transmission signal generating apparatus according to a fifth embodiment of the present invention.

FIG. 5 is a block diagram showing a transmission signal generating apparatus according to a fifth embodiment of the present invention. In FIG. 5, the same constituent elements as those in FIG. 3 are designated by the same reference numerals, and the description thereof will not be repeated here. In FIG. 5, reference numeral 24 indicates a serial decoder, and reference numeral 25 a CPU.

The fifth embodiment differs from the third embodiment in that the control signal generating section 17 is replaced by a control signal generating section 37; therefore, only the difference will be described here.

In this embodiment, the control signal generating section 37 comprises the voltage detection circuit 9, the CPU 25, and the serial decoder 24. The voltage detection circuit 9 receives the output of the low pass filter 8 which constitutes part of the PLL, and detects the output voltage level of the low pass filter 8 and compares it with a predetermined threshold voltage. The CPU 25 outputs prescribed serial data in accordance with the result of the comparison made with the threshold voltage by the voltage detection circuit 9. The serial decoder 24 receives the serial data output from the CPU 25, performs serial-to-parallel conversion, and controls the amplification factor of the variable amplifier 2 and the amplitude limiting range of the variable limiter 14.

Here, the CPU 25 has the function of generating the serial data that causes the amplification factor of the variable amplifier 2 to increase when the f/v sensitivity is shifted to the lower side and to decrease when the f/v sensitivity is shifted to the higher side, as well as the function of generating the serial data that causes the amplitude limiting range of the variable limiter 14 to become wider when the f/v sensitivity is shifted to the lower side and to become narrower when the f/v sensitivity is shifted to the higher side.

According to the above configuration, when the f/v sensitivity of the voltage controlled oscillator 4 is shifted toward the lower side as shown by the low f/v sensitivity characteristic B in FIG. 21, the amplification factor of the variable amplifier is increased as shown by the low f/v sensitivity characteristic B in FIG. 22, to prevent the frequency deviation at the time of modulation from becoming small; in this way, the modulation can be set to the maximum value of the given frequency band shown by the f/v sensitivity reference characteristic A in FIG. 21.

On the other hand, when the f/v sensitivity of the voltage controlled oscillator 4 is shifted toward the higher side as shown by the high f/v sensitivity characteristic C in FIG. 21, the amplitude limiting range of the variable limiter is reduced as shown by the high f/v sensitivity characteristic C in FIG. 22, to prevent the frequency deviation at the time of modulation from increasing and exceeding the given frequency band; in this way, the modulation can be set to the maximum value of the given frequency band shown by the f/v sensitivity reference characteristic A in FIG. 21. As a result, the voice signal can be transmitted with high transmission quality by making maximum use of the transmission frequency band, and at the same time, the frequency deviation during modulation can be accommodated within the given transmission frequency band.

Embodiment 6

Figure 24:
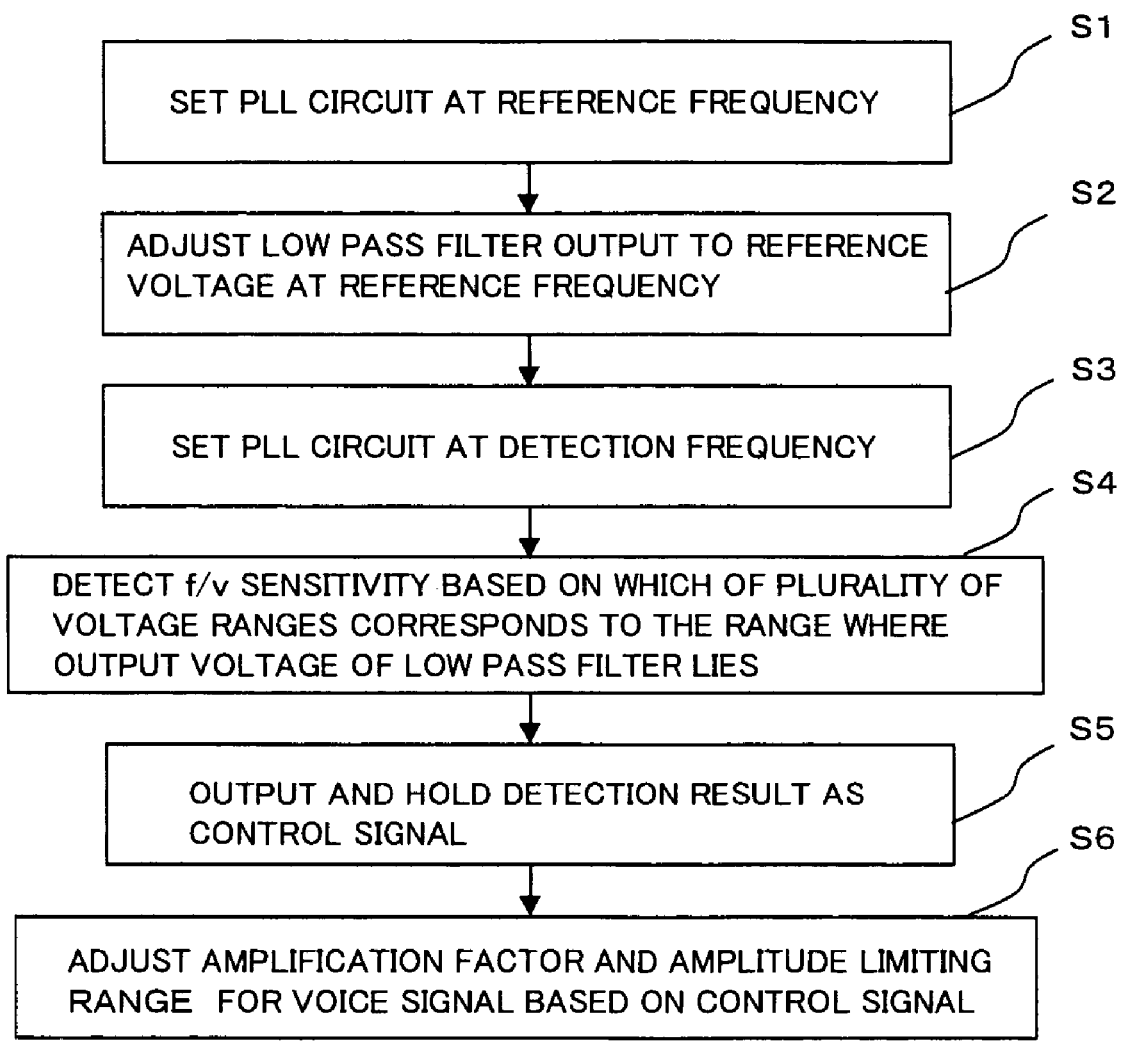
FIG. 24 is a flowchart illustrating the details of processing according to a sixth embodiment of the present invention.

FIG. 24 is a flowchart illustrating a method of adjusting the frequency deviation in frequency modulation in a transmission signal generating apparatus according to a sixth embodiment of the present invention. The method of adjusting the frequency deviation in frequency modulation in this transmission signal generating apparatus is applied, for example, to the transmission signal generating apparatus described in any one of the first to fifth embodiments.

The following procedure is carried out to implement means for detecting a variation in the f/v sensitivity of the voltage controlled oscillator. In a first step S1, the PLL circuit is set at the reference frequency designated "Fini" in FIG. 11. In a second step S2, the control voltage for the voltage controlled oscillator constituting part of the PLL circuit, that is, the output voltage of the low pass filter, is adjusted to the reference voltage, designated Vini, at the reference frequency Fini. In a third step S3, the PLL circuit is set at the detection frequency designated "ftest" in FIG. 11. In a fourth step S4, the output voltage of the low pass filter is detected with predetermined threshold values. More specifically, which one of the f/v sensitivity characteristics shown in FIG. 11, the f/v sensitivity reference characteristic A, the low f/v sensitivity characteristic B, or the high f/v sensitivity characteristic C, corresponds to the f/v sensitivity of the voltage controlled oscillator is determined by detecting in which one of the plurality of voltage ranges defined by the respective threshold values the output voltage of the low pass filter lies. In a fifth step S5, the results of the voltage detection are held for output by the latch signal.

To implement means for adjusting the amplification factor and the amplitude limiting range for the voice signal based on the results of the detection, a sixth step S6 is carried out in which, when the f/v sensitivity is shifted toward the lower side, the amplification factor of the voice signal is increased while also increasing the amplitude limiting range and, when the f/v sensitivity is shifted toward the higher side, the amplification factor is reduced while also reducing the amplitude limiting range.

According to the above adjusting method, when the f/v sensitivity of the voltage controlled oscillator 4 is shifted toward the lower side as shown by the low f/v sensitivity characteristic B in FIG. 21, the amplification factor of the voice signal is increased as shown by the low f/v sensitivity characteristic B in FIG. 22, to prevent the frequency deviation at the time of modulation from becoming small; in this way, the modulation can be set to the maximum value of the given frequency band shown by the f/v sensitivity reference characteristic A in FIG. 21.

On the other hand, when the f/v sensitivity of the voltage controlled oscillator 4 is shifted toward the higher side as shown by the high f/v sensitivity characteristic C in FIG. 21, the amplitude limiting range of the voice signal is reduced as shown by the high f/v sensitivity characteristic C in FIG. 22, to prevent the frequency deviation at the time of modulation from increasing and exceeding the given frequency band; in this way, the modulation can be set to the maximum value of the given frequency band shown by the f/v sensitivity reference characteristic A in FIG. 21.

As a result, the voice signal can be transmitted with high transmission quality by making maximum use of the transmission frequency band, and at the same time, the frequency deviation at the time of modulation can be accommodated within the given transmission frequency band.

While the above method has been described as adjusting both the amplification factor and amplitude limiting range of the voice signal, only one or the other of them may be adjusted.

INDUSTRIAL APPLICABILITY

The transmission signal generating apparatus of the present invention is advantageous for use as a transmission signal generating apparatus which, despite variations in the f/v sensitivity of the voltage controlled oscillator, can transmit the voice signal with high transmission quality by making maximum use of the transmission frequency band and can accommodate the frequency deviation at the time of modulation within the given transmission frequency band.

What is claimed is:

1. A transmission signal generating apparatus comprising:
   a phase locked loop containing a voltage controlled oscillator which has an input section for a voice signal and an input section for a frequency control voltage and whose oscillation frequency is controlled by said frequency control voltage, wherein said voice signal is input as a modulating signal to said voltage controlled oscillator and a transmission signal created by frequency modulation of said voice signal is output from said voltage controlled oscillator;
   amplitude control means, provided in said voice signal input section of said voltage controlled oscillator and having an input section for an amplitude control signal, for controlling the amplitude of said voice signal in accordance with said amplitude control signal; and
   a control signal generating section which generates said amplitude control signal by detecting the frequency/voltage sensitivity of said voltage controlled oscillator based on said frequency control voltage.

2. A transmission signal generating apparatus as set forth in claim 1, wherein said amplitude control means is a variable amplifier which amplifies said voice signal with an amplification factor varied in accordance with said amplitude control signal.

3. A transmission signal generating apparatus as set forth in claim 2, wherein said control signal generating section comprises a voltage detection circuit which compares said frequency control voltage with a predetermined threshold value and thereby detects the magnitude of said frequency control voltage, and a data latch circuit which holds a voltage detection result fed from said voltage detection circuit and outputs said result as said amplitude control signal to said variable amplifier.

4. A transmission signal generating apparatus as set forth in claim 2, wherein said variable amplifier comprises an operational amplifier, an input resistor provided in an input section of said operational amplifier, and a feedback circuit provided between said input section and an output section of said operational amplifier, and wherein
   said feedback circuit comprises a first feedback resistor connected between said input section and said output section of said operational amplifier, and at least one feedback resistive circuit provided with a switch and connected between said input section and said output section of said operational amplifier,
   said feedback resistive circuit provided with a switch is a series circuit constructed by connecting said switch in series to a second feedback resistor, and
   said switch is controlled on and off in accordance with said amplitude control signal.

5. A transmission signal generating apparatus as set forth in claim 1, wherein said amplitude control means is a variable limiter which limits the amplitude of said voice signal within an amplitude limiting range varied in accordance with said amplitude control signal.

6. A transmission signal generating apparatus as set forth in claim 5, wherein said control signal generating section comprises a voltage detection circuit which compares said frequency control voltage with a predetermined threshold value and thereby detects the magnitude of said frequency control voltage applied to said voltage controlled oscillator, and a data latch circuit which holds a voltage detection result fed from said voltage detection circuit and outputs said result as said amplitude control signal to said variable limiter.

7. A transmission signal generating apparatus as set forth in claim 5, wherein said variable limiter comprises: a resistor from one end of which said voice signal is input; an upper limit voltage limiting circuit which is connected to the other end of said resistor and which limits an upper limit value of the amplitude of said voice signal in accordance with an upper limit limiting voltage; a lower limit voltage limiting circuit which is connected to the other end of said resistor and which limits a lower limit value of the amplitude of said voice signal in accordance with a lower limit limiting voltage; a buffer amplifier whose input terminal is connected to said other end of said resistor; an upper limit limiting voltage source which supplies said upper limit limiting voltage to said upper limit voltage limiting circuit, said upper limit limiting voltage being increased or decreased under control of said amplitude control signal; and a lower limit limiting voltage source which supplies said lower limit limiting voltage to said lower limit voltage limiting circuit, said lower limit limiting voltage being increased or decreased under control of said amplitude control signal.

8. A transmission signal generating apparatus as set forth in claim 1, wherein said amplitude control means comprises a variable amplifier which amplifies said voice signal with an amplification factor varied in accordance with said amplitude control signal, and a variable limiter which limits the amplitude of said voice signal output from said variable amplifier within an amplitude limiting range varied in accordance with said amplitude control signal.

9. A transmission signal generating apparatus as set forth in claim 8, wherein said control signal generating section comprises a voltage detection circuit which compares said frequency control voltage with a predetermined threshold value and thereby detects the magnitude of said frequency control voltage applied to said voltage controlled oscillator, and a data latch circuit which holds a voltage detection result fed from said voltage detection circuit and outputs said result as said amplitude control signal to said variable amplifier and said variable limiter.

10. A transmission signal generating apparatus as set forth in claim 8, wherein:
    a microphone for converting said voice signal into an electrical signal is provided in an input section of said variable amplifier;

a pre-emphasis circuit for emphasizing high frequencies of said voice signal output from said variable amplifier is provided between said variable amplifier and said variable limiter;

a splatter filter for limiting unwanted high frequencies contained in said voice signal output from said variable limiter is provided between said variable limiter and said voltage controlled oscillator; and a transmitter for amplifying and band-limiting an output of said voltage controlled oscillator and an antenna for radiating an output of said transmitter as a transmission wave into space are provided in an output section of said voltage controlled oscillator.

11. A transmission signal generating apparatus as set forth in claim 8, wherein said control signal generating section comprises a voltage detection circuit which compares said frequency control voltage with a predetermined threshold value and thereby detects the magnitude of said frequency control voltage applied to said voltage controlled oscillator, a CPU which outputs prescribed serial data responsive to a voltage detection result fed from said voltage detection circuit, and a serial decoder which generates said amplitude control signal based on said serial data.

* * * * *